US011825758B2

(12) United States Patent
Rupp et al.

(10) Patent No.: US 11,825,758 B2
(45) Date of Patent: Nov. 21, 2023

(54) RESISTIVE SWITCHING DEVICES CONTAINING LITHIUM TITANATE, AND ASSOCIATED SYSTEMS AND METHODS

(71) Applicant: Massachusetts Institute of Technology, Cambridge, MA (US)

(72) Inventors: Jennifer Rupp, Cambridge, MA (US); Juan Carlos Gonzalez Rosillo, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 635 days.

(21) Appl. No.: 16/797,391

(22) Filed: Feb. 21, 2020

(65) Prior Publication Data
US 2020/0274065 A1    Aug. 27, 2020

Related U.S. Application Data

(60) Provisional application No. 62/809,120, filed on Feb. 22, 2019.

(51) Int. Cl.
H10N 70/00    (2023.01)
C01G 23/00    (2006.01)
H10N 70/20    (2023.01)

(52) U.S. Cl.
CPC ....... *H10N 70/8836* (2023.02); *C01G 23/005* (2013.01); *H10N 70/235* (2023.02);
(Continued)

(58) Field of Classification Search
CPC . H01L 45/065; H01L 45/085; H01L 45/1206; H01L 45/1226; H01L 45/1233;
(Continued)

(56) References Cited

U.S. PATENT DOCUMENTS 10,083,974 B1    9/2018  Huang et al.
10,467,524 B1 *  11/2019  Todorov ............ H10N 70/8836
(Continued)

FOREIGN PATENT DOCUMENTS

WO    WO 2020/036927    2/2020
WO    WO 2020/036936    2/2020

OTHER PUBLICATIONS

PCT/US2020/019165, Jun. 25, 2020, International Search Report and Written Opinion.
(Continued)

*Primary Examiner* — Omar F Mojaddedi
(74) *Attorney, Agent, or Firm* — Wolf, Greenfield & Sacks, P.C.

(57) ABSTRACT

Resistive switching devices that contain lithium, including resistive switching devices containing a lithium titanate, and associated systems and methods are generally described. In some cases, the resistive switching device contains a lithium titanate-containing domain, a first electrode, and a second electrode. In some cases, the application of an electrical potential to the resistive switching device causes a change in resistance state of the lithium titanate-containing domain. The resistive switching devices described herein may be useful as memristors, and in applications that include Resistive-random access memory and neuromorphic computing.

14 Claims, 34 Drawing Sheets

(52) U.S. Cl.
CPC ....... H10N 70/253 (2023.02); *C01P 2002/72* (2013.01); *C01P 2002/82* (2013.01); *C01P 2004/03* (2013.01); *C01P 2004/04* (2013.01); *C01P 2006/40* (2013.01)

(58) Field of Classification Search
CPC ... H01L 45/147; H01L 45/16; H01L 45/1625; H10N 70/011; H10N 70/026; H10N 70/235; H10N 70/245; H10N 70/253; H10N 70/823; H10N 70/826; H10N 70/8836; C01G 23/005; C01P 2002/72; C01P 2002/82
See application file for complete search history.

(56) References Cited

U.S. PATENT DOCUMENTS

| | | | | |
|---|---|---|---|---|
| 2018/0277552 | A1* | 9/2018 | Huang | H01L 45/16 |
| 2018/0341849 | A1 | 11/2018 | Brew et al. | |
| 2018/0374535 | A1* | 12/2018 | Brew | H01L 45/1233 |
| 2019/0044457 | A1* | 2/2019 | Shuminskyi | C01G 23/006 |
| 2020/0020976 | A1* | 1/2020 | Isomichi | H01M 10/0525 |

OTHER PUBLICATIONS

Ambrogio et al., Equivalent-accuracy accelerated neural network training using analogue memory. Nature. Jun. 7, 2018;558:60-7. Supplemental information included. 22 pages total.
Bai et al., Charge transfer kinetics at the solid-solid interface in porous electrodes. Nat Commun. 2014;5:3585. Epub Apr. 3, 2014. 7 pages.
Bai et al., Suppression of phase separation in $LiFePO_4$ nanoparticles during battery discharge. Nano Lett. 2011;11(11):4890-4896. Epub Oct. 10, 2011.
Banno et al., Effect of Ion Diffusion on Switching Voltage of Solid-Electrolyte Nanometer Switch. Jpn J Appl Phys. 2006;45(4B):3666-8. Epub Apr. 25, 2006.
Bazant, Theory of chemical kinetics and charge transfer based on nonequilibrium thermodynamics. Acc Chem Res. 2013;46(5):1144-1160. Epub Mar. 22, 2013.
Bazant, Thermodynamic stability of driven open systems and control of phase separation by electro-autocatalysis. Faraday Discuss. 2017;199:423-463. Epub Feb. 17, 2017.
Berggren, On the Herzfeld theory of metallization. Application to doped semiconductors, electron-hole liquids in semiconductors, and expanded states of simple metals. J Chem Phys. May 1974;60:3399-402.
Burr et al., Overview of candidate device technologies for storage-class memory. IBM J Res Dev. Jul. 2008;52(4/5):449-64.
Gonzalez-Rosillo et al., Lithium-Battery Anode Gains Additional Functionality for Neuromorphic Computing through Metal-Insulator Phase Separation. Advanced Materials. Mar. 2020;32(9):1907465. Epub Jan. 20, 2020. 12 pages.
Chua, Memristor—The missing circuit element. IEEE Trans Circuit Theory. Sep. 1971;18(5):507-19.
Cogswell et al., Theory of coherent nucleation in phase-separating nanoparticles. Nano Lett. 2013;13(7):3036-3041. Epub May 2, 2013.
Colbow et al., Structure and electrochemistry of the spinel oxides $LiTi_2O_4$ and $LiTiO_4$. J Power Sources. May 16, 1989;26(3-4):397-402.
Fuller et al., Li-Ion Synaptic Transistor for Low Power Analog Computing. Adv Mater. 2017;29(4):1604310. Epub Nov. 22, 2016. 8 pages.
Ganapathy et al., The Fine Line between a Two-Phase and Solid-Solution Phase Transformation and Highly Mobile Phase Interfaces in Spinel $Li_{4+x}Ti_5O_{12}$. Adv Energy Mater. 2017;7(9):1601781. Epub Dec. 28, 2016. 12 pages.

Gavish et al., Spatially localized self-assembly driven by electrically charged phase separation. Siam J Appl Dyn Syst. 2017;16(4):1946-68. Epub Oct. 12, 2017.
Gokmen et al., Acceleration of Deep Neural Network Training with Resistive Cross-Point Devices: Design Considerations. Front Neurosci. 2016;10:333. Epub Jul. 21, 2016. 13 pages.
Greenlee et al., In-situ oxygen x-ray absorption spectroscopy investigation of the resistance modulation mechanism in $LiNbO_2$ memristors. Appl Phys Lett. 2012;100:182106. Epub May 4, 2012. 4 pages.
Greenlee et al., Radiation Effects on $LiNbO_2$ Memristors for Neuromorphic Computing Applications. IEEE Trans Nucl Sci. Dec. 2013;60(6):4555-62.
Herzfeld, On atomic properties which make an element an et al. Phys Rev. May 1927;29:701-5.
Hickmott, Low-frequency negative resistance in thin anodic oxide films. J Appl Phys. Sep. 1962;33(9):2669-82.
Hoshino et al., Diffusion and point defects in $TiO_{2-x}$. J Phys Chem Solids. Dec. 1985;46(12):1397-411.
Indiveri et al., Integration of nanoscale memristor synapses in neuromorphic computing architectures. Nanotechnology. 2013;24:384010. Epub Sep. 2, 2013. 13 pages.
Janek et al., A solid future for battery development. Nat Energy. Sep. 8, 2016;1:16141. Epub Sep. 8, 2016. 4 pages.
Jiang et al., Enhanced oxygen vacancy diffusion in $Ta_2O_5$ resistive memory devices due to infinitely adaptive crystal structure. J Appl Phys. 2016;119:134502. Epug Apr. 6, 2016. 6 pages.
Kellerman et al., Structure peculiarities of carbon-coated lithium titanate: Raman spectroscopy and electron microscopic study. Solid State Sci. 2012;14:72-9. Epub Nov. 4, 2011.
Knauth, Inorganic solid Li ion conductors: An overview. Solid State Ion. 2009;180:911-6. Epub May 19, 2009.
Kozicki et al., Conductive bridging random access memory—materials, devices and applications. Semiconductor Science and Technology. 2016;31:113001. Epub Oct. 5, 2016. 32 pages.
Kubicek et al., Uncovering Two Competing Switching Mechanisms for Epitaxial and Ultrathin Strontium Titanate-Based Resistive Switching Bits. ACS Nano. 2015;9(11):10737-48. Epub Oct. 8, 2015.
Lee et al., A fast, high-endurance and scalable non-volatile memory device made from asymmetric $Ta_2O_{5-x}/TaO_{2-x}$ bilayer structures. Nat Mater. Aug. 2011;10:625-30. Epub Jul. 10, 2011.
Leonidov et al., Structure, Ionic Conduction, and Phase Transformations in Lithium Titanate $Li_4Ti_5O_{12}$. Phys Solid State. Nov. 2003;45(11):2183-8.
Li et al., Electrochemical and Chemical Insertion for Energy Transformation and Switching. Annu Rev Mater Res. Jul. 2018;48:137-65.
Lim et al., Origin and hysteresis of lithium compositional spatiodynamics within battery primary particles. Science. Aug. 5, 2016;353(6299):566-71.
Linares-Barranco et al., Memristance can explain Spike-Time-Dependent-Plasticity in Neural Synapses. Nat Prec. 2009;3010. Epub Mar. 31, 2009. 4 pages.
Liu et al., The first-principles study for the novel optical properties of $LiTi_2O_4$, $Li_4Ti_5O_{12}$, $Li_2Ti_2O_4$ and $Li_7Ti_5O_{12}$. Chem Phys Lett. 2017;677:114-9. Epub Apr. 4, 2017.
Lu et al., Lithium Storage in $Li_4Ti_5O_{12}$ Spinel: The Full Static Picture from Electron Microscopy. Adv Mater. 2012;24:3233-8. Epub May 16, 2012.
Mai et al., Memristive and neuromorphic behavior in a $Li_xCoO_2$ nanobattery. Sci Rep. Jan. 14, 2015;5:7761. Epub Jan. 14, 2015. 6 pages.
Mesoraca et al., Lithium outdiffusion in $LiTi_2O_4$ thin films grown by pulsed laser deposition. Journal of Cryst Growth. 2016;454:134-8. Epub Sep. 9, 2016.
Messerschmitt et al., Memristor Kinetics and Diffusion Characteristics for Mixed Anionic-Electronic $SrTiO_{3-d}$ Bits: The Memristor-Based Cottrell Analysis Connecting Material to Device Performance. Adv Funct Mater. 2014;24:7448-60. Epub Sep. 25, 2014.
Miara et al., First-Principles Studies on Cation Dopants and ElectrolytelCathode Interphases for Lithium Garnets. Chem Mater. 2015;27:4040-7. Epub Apr. 30, 2015.

(56) References Cited

OTHER PUBLICATIONS

Milewska et al., The nature of the nonmetal-metal transition in LixCoO2 oxide. Solid State Ion. 2014;263:110-8. Epub Jun. 10, 2014.
Moradpour et al., Resistive Switching Phenomena in LixCoO2 Thin Films. Adv Mater. 2011;23:4141-5. Epub Aug. 5, 2011.
Mukai et al., Understanding the Zero-Strain Lithium Insertion Scheme of Li[Li1/3Ti5/3]O4: Structural Changes at Atomic Scale Clarified by Raman Spectroscopy. J Phys Chem C. 2014;118:2992-9. Epub Jan. 23, 2014.
Murugan et al., Fast Lithium Ion Conduction in Garnet-Type Li7La3Zr2O12. Angew Chem Int Ed. 2007;46:7778-81. Epub Sep. 5, 2007.
Nadkarni et al., Interplay of phase boundary anisotropy and electro-auto-catalytic surface reactions on the lithium intercalation dynamics in LiXFePO4 plateletlike nanoparticles. Phys Rev Materials 2. 2018;2:085406. Epub Aug. 16, 2018. 13 pages.
Nadkarni et al., Modeling the Metal-Insulator Phase Transition in LixCoO2 for Energy and Information Storage. Adv Funct Mater. 2019;29(40):1902821. Epub Aug. 9, 2019. 9 pages.
Nakamura et al., Diffusion of oxygen in amorphous Al2O3, Ta2O5, and Nb2O5. J Appl Phys. 2014;116:033504. Epub Jul. 15, 2014. 8 pages.
Nguyen et al., Direct Evidence of Lithium Ion Migration in Resistive Switching of Lithium Cobalt Oxide Nanobatteries. Small. 2018;14(24):1801038. Epub May 17, 2018. 7 pages.
Orfanidou et al., Stoichiometry and volume dependent transport in lithium ion memristive devices. AIP Adv. 2018;8:115211. Epub Nov. 13, 2018. 6 pages.
Orizaga et al., Instability and reorientation of block copolymer microstructure by imposed electric fields. Phy Rev E. 2016;93:052504. Epub May 16, 2016. 13 pages.
Pan et al., Recent progress in resistive random access memories: Materials, switching mechanisms, and performance. Mater Sci Eng R. 2014;83:1-59. Epub Jul. 10, 2014.
Pelegov et al., Raman spectroscopy, "big data", and local heterogeneity of solid state synthesized lithium titanate. J Power Sources. 2017;346:143-50. Epub Feb. 17, 2017.
Pfenninger et al., A low ride on processing temperature for fast lithium conduction in garnet solid-state battery films. Nat Energy. Jun. 2019;4:475-83. Epub May 20, 2019.
Pfenninger et al., Lithium Titanate Anode Thin Films for Li-Ion Solid State Battery Based on Garnets. Adv Funct Mater. 2018;28(21):1800879. Epub Apr. 14, 2018. 8 pages.
Prezioso et al., Training and operation of an integrated neuromorphic network based on metal-oxide memristors. Nature. May 7, 2015;521:61-4.
Put et al., On the chemistry and electrochemistry of LiPON breakdown. J Mater Chem A. 2018;6(11):4848-59. Epub Mar. 1, 2018.
Ronci et al., High-Resolution In-Situ Structural Measurements of the Li4/3Ti5/3O4 "Zero-Strain" Insertion Material. J Phys Chem B. 2002;106:3082-6. Epub Mar. 6, 2002.
Sawa, Resistive switching in transition metal oxides. Mater Today. Jun. 2008;11(6):28-36.
Schindler et al., Low current resistive switching in Cu-SiO2 cells. Appl Phys Lett. 2008;92:122910. Epub Mar. 27, 2008. 3 pages.
Schmidt et al., Small Change-Great Effect: Steep Increase of Li Ion Dynamics in Li4Ti5O12 at the Early Stages of Chemical Li Insertion. Chem Mater. 2015;27(5):1740-50. Epub Feb. 5, 2015.
Schmitt et al., Accelerated Ionic Motion in Amorphous Memristor Oxides for Nonvolatile Memories and Neuromorphic Computing. Adv Funct Mater. Dec. 17, 2018;29:1804782. Epub Dec. 17, 2018. 12 pages.
Schmitt et al., Design of Oxygen Vacancy Configuration for Memristive Systems. ACS Nano. 2017;11:8881-91. Epub Aug. 29, 2017.
Schweiger et al., Designing Strained Interface Heterostructures for Memristive Devices. Adv Mater. 2017;29:1605049. Epub Feb. 13, 2017. 11 pages.

Sebastian et al., Tutorial: Brain-inspired computing using phase-change memory devices. Journal of Applied Physics. 2018;124:111101. Epub Sep. 18, 2018. 15 pages.
Sediva et al., In Situ Method Correlating Raman Vibrational Characteristics to Chemical Expansion via Oxygen Nonstoichiometry of Perovskite Thin Films. Adv Mater. 2019;31:1902493. Epub Jun. 25, 2019. 9 pages.
Shi et al., Behavioral Plasticity Emulated with Lithium Lanthanum Titanate-Based Memristive Devices: Habituation. Adv Electron Mater. 2017;3(9):1700046. Epub Jul. 17, 2017. 10 pages.
Shin et al., Synergistic multi-doping effects on the Li7La3Zr2O12 solid electrolyte for fast lithium ion conduction. Sci Rep. 2015;5:18053. Epub Dec. 15, 2015. 9 pages.
Singh et al., Intercalation dynamics in rechargeable battery materials: General theory and phase-transformation waves in LiFePO4. Electrochim Acta. 2008;53:7599-613. Epub Apr. 14, 2008.
Stanje et al., Solid Electrolytes: Extremely Fast Charge Carriers in Garnet-Type Li6La3ZrTaO12 Single Crystals. Ann Phys (Berlin). 2017;529:1700140. Epub Sep. 15, 2017. 9 pages.
Svoukis et al., Data storage applications based on LiCoO2 thin films grown on A12O3 and Si substrates. Appl Surf Sci. 2016;381:22-7. Epub Feb. 23, 2016.
Terabe et al., Quantized conductance atomic switch. Nature. Jan. 6, 2005;433:47-50.
Valov et al., Electrochemical metallization memories—fundamentals, applications, prospects. Nanotechnology. 2011;22:254003. Epub May 16, 2011. Corrigendum in Nanotechnology. Jun. 6, 2011;22:289502. 23 pages total.
Van Den Broek et al., Interface-Engineered All-Solid-State Li-Ion Batteries Based on Garnet-Type Fast Li + Conductors. Adv Energy Mater. Jul. 12, 2016;6:1600736. Epub Jul. 12, 2016. 11 pages.
Vasileiadis et al., Toward Optimal Performance and In-Depth Understanding of Spinel Li4Ti5O12 Electrodes through Phase Field Modeling. Adv Funct Mater. 2018;28:1705992. Epub Feb. 19, 2018. 18 pages.
Verde et al., Elucidating the Phase Transformation of Li4Ti5O12 Lithiation at the Nanoscale. ACS Nano. 2016;10:4312-21. Epub Mar. 15, 2016.
Vikram Babu et al., Structural and electrical properties of Li4Ti5O12 anode material for lithium-ion batteries. Results Phys. 2018;9:284-9. Epub Feb. 27, 2018.
Wagemaker et al., A Kinetic Two-Phase and Equilibrium Solid Solution in Spinel Li4+xTi5O12. Adv Mater. 2006;18:3169-73. Epub Nov. 10, 2006.
Wang et al., Experimental study of LiNbO3 memristors for use in neuromorphic computing. Microelectron Eng. 2017;168:37-40. Epub Oct. 17, 2017.
Wang et al., Fully memristive neural networks for pattern classification with unsupervised learning. Nat Electron. Feb. 2018;1:137-45. Epub Feb. 8, 2018.
Waser et al., Nanoionics-based resistive switching memories. Nat Mater. Nov. 2007;6:833-40.
Waser et al., Redox-Based Resistive Switching Memories—Nanoionic Mechanisms, Prospects, and Challenges. Adv Mater. 2009;21(25-6):2632-63. Epub Jul. 6, 2009.
Wedig et al., Nanoscale cation motion in TaOx, HfOx and TiOx memristive systems. Nat Nanotechnol. Jan. 2016;11:67-74. Epub Sep. 28, 2015. Methods included. 9 pages total.
Xia et al., Li diffusion in LiCoO2 thin films prepared by pulsed laser deposition. J Power Sources. 2006;159:1422-7. Epub Feb. 2, 2006.
Yakopcic et al., Filament formation in lithium niobate memristors supports neuromorphic programming capability. Neural Comput & Applic. 2017;30:3773-9. Epub Mar. 24, 2017.
Yang et al., Memristive devices for computing. Nat Nanotechnol. Jan. 2013;8:13-24. Epub Dec. 27, 2012.
Yi et al., Recent advances of Li4Ti5O12 as a promising next generation anode material for high power lithium-ion batteries. J Mater Chem A. 2015;3(11):5750-77. Epub Jan. 21, 2015.
Young et al., Electronic Conductivity in the Li4/3Ti5/3O4-Li7/3Ti5/3O4 System and Variation with State-of-Charge as a Li Battery Anode. Adv Energy Mater. 2013;3:1125-9. Epub Apr. 19, 2013.

(56) References Cited

OTHER PUBLICATIONS

Zhao et al., A comprehensive review of Li4Ti5O12-based electrodes for lithium-ion batteries: The latest advancements and future perspectives. Mater Sci Eng R. 2015;98:1-71. Epub Dec. 1, 2015.

Zhou et al., Correlated Electron Materials and Field Effect Transistors for Logic: A Review. Critical Reviews in Solid State and Materials Sciences. 2013;38(4):286-317. Epub Aug. 1, 2013.

Zhu et al., Direct observation of lithium-ion transport under an electrical field in LixCoO2 nanograins. Sci Rep. 2013;3:1084. Epub Jan. 17, 2013. 8 pages.

Zhu et al., In Situ Nanoscale Electric Field Control of Magnetism by Nanoionics. Adv Mater. 2016;28:7658-65. Epub Jun. 27, 2016.

Ziebarth et al., Lithium diffusion in the spinel phase Li4Ti5O12 and in the rocksalt phase Li7Ti5O12 of lithium titanate from first principles. Phys Rev B. May 9, 2014;89:174301. Epub May 9, 2014. 7 pages.

International Search Report and Written Opinion dated Jun. 25, 2020 for PCT/US2020/019165.

\* cited by examiner

RESISTIVE SWITCHING DEVICES CONTAINING LITHIUM TITANATE, AND ASSOCIATED SYSTEMS AND METHODS

RELATED APPLICATIONS

This application claims priority under 35 U.S.C. § 119(e) to U.S. Provisional Application No. 62/809,120, filed Feb. 22, 2019, and entitled "Resistive Switching Devices Containing Lithium Titanate, and Associated Systems and Methods," which is incorporated herein by reference in its entirety for all purposes.

GOVERNMENT SPONSORSHIP

This invention was made with government support under DMR1419807 awarded by the National Science Foundation. The government has certain rights in the invention.

TECHNICAL FIELD

Resistive switching devices that contain lithium, including resistive switching devices containing a lithium titanate, and associated systems and methods are generally described.

BACKGROUND

Resistive switching devices, such as memristors, are devices capable of switching between resistance states upon the application of an electrical potential (i.e., voltage) to the device. Resistive switching devices may be useful in certain applications, such as Resistive random-access memory (Re-RAM) devices and in chips for neuromorphic computing. Therefore, improved materials and device architectures for resistive switching devices are desirable.

SUMMARY

Resistive switching devices that contain lithium, including resistive switching devices containing a lithium titanate, and associated systems and methods are generally described. The subject matter of the present invention involves, in some cases, interrelated products, alternative solutions to a particular problem, and/or a plurality of different uses of one or more systems and/or articles.

In one aspect, a resistive switching device is described. In some embodiments, the resistive switching device comprises a lithium titanate-containing domain. In certain cases, the resistive switching device comprises a first electrode in contact with the lithium titanate-containing domain, and a second electrode in contact with the lithium titanate-containing domain.

In another aspect, a method is described. In some embodiments, the method comprises applying an electrical potential to a resistive switching device comprising a lithium titanate-containing domain.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures.

DETAILED DESCRIPTION

Figure 1A:
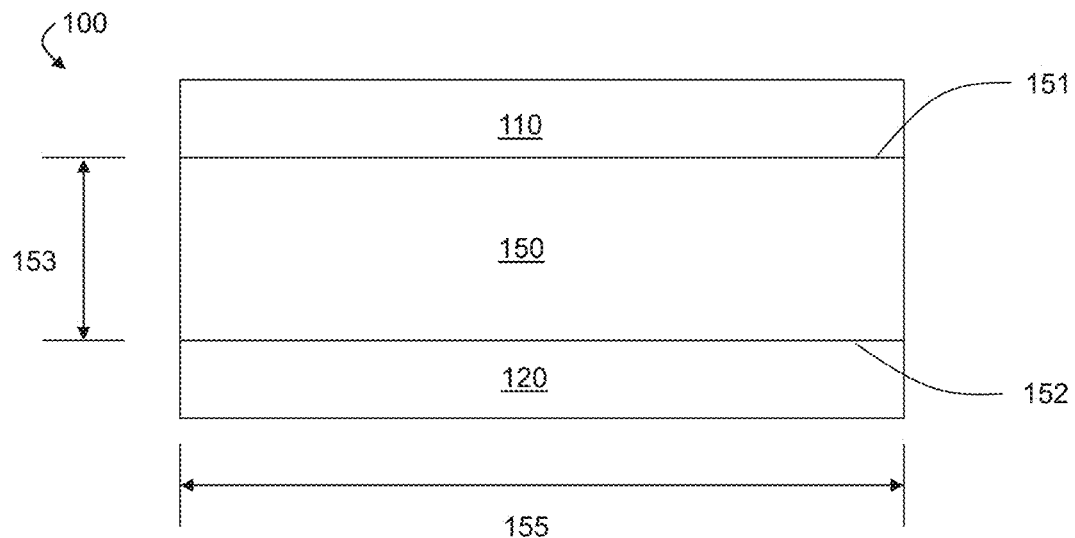
FIG. 1A shows a cross-sectional schematic diagram of an exemplary resistive switching device comprising a lithium titanate-containing domain, according to some embodiments.

Resistive switching devices that contain lithium, including resistive switching devices containing a lithium titanate, and associated systems and methods are generally described. In some cases, the resistive switching device is a memristor. Some such resistive switching devices (e.g., memristors) may be useful for certain applications for which downsizing of conventional technologies is difficult, such as in information storage technologies or in computing applications requiring relatively high parallelization, such as neuromorphic computing (e.g., on a neuromorphic chip). In some embodiments, a resistive switching device (e.g., memristor) comprising a lithium titanate-containing domain in contact with a first electrode and a second electrode is described. In some, but not necessarily all embodiments, the resistive switching device comprising a lithium-titanate-containing domain exhibits certain beneficial resistive switching properties, including, but not limited to, a relatively high resistance ratio, a relatively high retention, relatively high symmetry, an avoidance or reduction in electroforming, lowered stochasticity, and/or a relatively low power consumption (e.g., due to a relatively low voltage window and/or low current during operation). The use of lithium titanate as a material for resistive switching may be advantageous, in some, but not necessarily all cases. For example, in certain cases, lithium titanate can operate under low voltages. Certain lithium titanates have low lattice strain upon redox-state change (unlike other lithium-containing materials such as lithium cobalt oxides). Lithium titanate can also have a wide electrochemical window, an ability to undergo a metal-insulator transition, and can be relatively environmentally friendly compared to other materials typically used in resistive switching devices (such as those that use oxygen, copper, or silver as ion carriers, or those that use other lithium-containing materials).

In one aspect, methods of operating resistive switching devices are described. Certain methods comprise applying an electrical potential to a resistive switching device comprising a lithium titanate-containing domain (e.g., applying a voltage to a lithium titanate-containing memristor). Applying an electrical potential to the resistive switching device may cause the lithium titanate-containing domain to switch electrical resistance states. For example, the lithium titanate containing domain may have a first electrical resistance in the absence of the electrical potential, and then, after the electrical potential is applied and its magnitude is reduced, the lithium titanate-containing domain may have a second, different electrical resistance when the reducing of the magnitude of the electrical potential is stopped (e.g., a hysteresis in a current-voltage curve may be observed). Some methods comprise determining an electrical resistance or conductance of the resistive switching device (e.g., to determine when the resistive switching device is in a first resistance state or a second resistance state). In certain cases, the resistive switching device may comprise additional components, such as a solid lithium-conducting electrolyte domain and a solid lithium ion source disposed on the lithium-containing domain, such that an application of a second electrical potential across a second electrode set (e.g., in the case of a 3-terminal system) causes Li ions to intercalate into or deintercalate from the lithium titanate-containing domain (e.g., by crossing an interface between the lithium titanate-containing domain and the solid lithium-conducting electrolyte domain). In some such cases, such controlled Li intercalation and/or deintercalation in the lithium titanate-containing domain may change resistive switching properties of the lithium titanate-containing domain. Tuning such resistive switching properties may be useful, in accordance with certain embodiments, for a number of applications, such as resistive random-access memory (ReRAM) devices, as well as in computer chips using non-volatile memristor architectures (e.g., memristors at multiple nodes, with different nodes having differing lithiation degrees), and where ultra-low power consumption and multilevel states (e.g., analog operation) are desirable.

In one aspect, a resistive switching device is described. FIG. 1A depicts exemplary resistive switching device 100, according to certain embodiments. In some embodiments, the resistive switching device comprises a lithium titanate-containing domain. For example, referring again to FIG. 1A, resistive switching device 100 comprises lithium titanate-containing domain 150. In certain cases, the lithium titanate-containing domain of the resistive switching device is the domain of the device in which an electrical potential-induced change in resistance and/or resistance state occurs (e.g., during operation of the resistive-switching device). Without being bound by any particular theory, the lithium titanate-containing device may undergo changes in resistance and/or resistance state upon application of an electrical potential to the resistive switching device due to a spatial rearrangement of lithium ions within the lithium-containing domain, a structural change of the material (e.g., a change in lattice structure), and/or a change in lithiation of the lithium titanate-containing domain.

In some embodiments, the lithium titanate contained in the lithium titanate-containing domain is characterized by the chemical formula $Li_{4x+3}Ti_5TiO_{12}$, where x is an integer. As an example, lithium titanate-containing domain 150 of resistive switching device 100 comprises a lithium titanate having a chemical formula of $Li_{4x+3}Ti_5TiO_{12}$, in accordance with certain embodiments. In some cases, the lithium titanate of the lithium titanate-containing domain has a chemical formula of $Li_4Ti_5TiO_{12}$. In certain cases, the lithium titanate of the lithium titanate-containing domain has a chemical formula of $Li_7Ti_5TiO_{12}$. In certain cases, the lithium titanate-containing domain comprises a combination of both $Li_4Ti_5TiO_{12}$ and $Li_7Ti_5TiO_{12}$ (e.g., in cases in which the lithium titanate-containing domain undergoes a phase segregation). In certain cases, dopants (e.g., niobium) and/or impurities may be present, either interstitially or at lattice sites.

In some embodiments, a relatively high percentage of the lithium titanate-containing domain is lithium titanate. For example, in some embodiments, lithium titanate is present in the lithium titanate-containing domain in a weight percentage of greater than or equal to 60%, greater than or equal to 70%, greater than or equal to 80%, greater than 90%, and/or up to 95%, up to 99% or higher. In some embodiments, the lithium titanate is present in the lithium titanate-containing domain in a weight percentage of 100%.

In some embodiments, a relatively high percentage of the lithium titanate-containing domain is $Li_4Ti_5TiO_{12}$. It has been discovered in the context of the present disclosure that some resistive switching devices comprising lithium titanate-containing domains having a relatively high percentage of $Li_4Ti_5TiO_{12}$ can have resistive switching properties useful for particular applications. For example, resistive switching devices having a high percentage of $Li_4Ti_5TiO_{12}$ can exhibit asymmetric switching with low retention, which can be useful for spiking neural network applications. In some embodiments, $Li_4Ti_5TiO_{12}$ is present in the lithium titanate-containing domain in a weight percentage of greater than or equal to 60%, greater than or equal to 70%, greater than or equal to 80%, greater than 90%, and/or up to 95%, up to 99% or higher. In some embodiments, the $Li_4Ti_5TiO_{12}$ is present in the lithium titanate-containing domain in a weight percentage of 100%.

In some embodiments, a relatively high percentage of the lithium titanate-containing domain is $Li_7Ti_5TiO_{12}$. It has been discovered in the context of the present disclosure that some resistive switching devices comprising lithium titanate-containing domains having a relatively high percentage of $Li_7Ti_5TiO_{12}$ can have resistive switching properties useful for particular applications. For example, resistive switching devices having a high percentage of $Li_7Ti_5TiO_{12}$ can exhibit symmetric switching with high retention, which can be useful for deep neural network applications. In some embodiments, a relatively high percentage of the lithium titanate-containing domain is $Li_7Ti_5TiO_{12}$. For example, in some embodiments, $Li_7Ti_5TiO_{12}$ is present in the lithium titanate-containing domain in a weight percentage of greater than or equal to 60%, greater than or equal to 70%, greater than or equal to 80%, greater than 90%, and/or up to 95%, up to 99% or higher. In some embodiments, the $Li_7Ti_5TiO_{12}$ is present in the lithium titanate-containing domain in a weight percentage of 100%.

The lithium titanate-containing domain may be in the form of a film. For example, in some embodiments, the lithium titanate-containing domain is a thin film. In certain cases in which the lithium titanate-containing domain is in the form of the thin film, the thin film has a relatively small thickness. For example, in some embodiments, the lithium titanate-containing domain is a thin film that has a thickness of less than or equal to 1 μm, less than or equal to 500 nm, less than or equal to 100 nm, less than or equal to 90 nm, less than or equal to 80 nm, or less. In some embodiments, the lithium titanate-containing domain is a thin film that has a thickness of greater than or equal to 5 nm, greater than or equal to 10 nm, greater than or equal to 20 nm, or more. Combinations of these ranges are also possible. For example, in some embodiments, the lithium titanate-containing domain is a thin film that has a thickness of greater than or equal to 5 nm and less than or equal to 1 μm.

In some embodiments in which the lithium titanate-containing domain is in the form of the film, the film has a thickness as well as two orthogonal lateral dimensions that are orthogonal to each other as well as orthogonal to the thickness. For example, referring to FIG. 1A, in accordance with certain embodiments, lithium titanate-containing domain 150 has thickness 153, lateral dimension 155, and a second lateral dimension (not pictured) orthogonal to both thickness 153 and lateral dimension 155 (which would run into and out of the plane of the drawing in FIG. 1A).

In some embodiments, at least one of the lateral dimensions of the film is greater than the thickness of the film. For example, in accordance with certain embodiments, lateral dimension 155 is greater than thickness 153 of lithium titanate-containing domain 150. In some embodiments, at least one of the lateral dimensions is at least 5 times, at least 10 times, at least 100 times, at least 1000 times, at least 10,000 times, at least 100,000 times, or at least 1 million times greater than the thickness of the film. In some embodiments, both of the lateral dimensions are at least 5 times, at least 10 times, at least 100 times, at least 1000 times, at least 10,000 times, at least 100,000 times, or at least 1 million times greater than the thickness of the film.

The lithium-containing domain may be fabricated by, for example, employing a physical vapor deposition (PVD) technique using a lithium titanate-containing target. Exemplary physical vapor deposition techniques include, but are not limited to, pulsed laser deposition, evaporative deposition, and sputtering (e.g., radio frequency sputtering). In some cases, the conditions used for fabrication may be altered in order to tune the degree of lithiation of the resulting lithium titanate-containing domain. For example, in some cases, a single lithium titanate (e.g., $Li_{7.1}Ti_5O_{12}$) target is used in a PVD technique to form a lithium titanate-containing domain with a relatively low lithiation degree (e.g., $Li_4Ti_5TiO_{12}$). In other cases, a lithium titanate (e.g., $Li_{7.1}Ti_5O_{12}$) target is used in addition to a target comprising lithium and nitrogen (e.g., a lithium nitride such as $Li_3N$) in order to create a multilayer structure that can be annealed to form a lithium titanate-containing domain with a relatively high lithiation degree (e.g., $Li_7Ti_5TiO_{12}$).

In some embodiments, the resistive switching device comprises a first electrode in contact with the lithium titanate-containing domain. Additionally, in certain embodiments, the resistive switching device comprises a second electrode in contact with the lithium titanate-containing domain as well. Referring again to FIG. 1A, exemplary resistive switching device 100 comprises first electrode 110 in contact with lithium titanate-containing domain 150, and second electrode 120 in contact with lithium titanate-containing domain 150. In some cases, the first electrode and the second electrode are in direct contact with the lithium titanate-containing domain, such that there is no intervening material between the first electrode and the lithium titanate-containing domain and between the second electrode and the lithium titanate-containing domain.

Those of ordinary skill would understand, given the guidance provided by this disclosure, suitable materials for the first electrode and the second electrode. For example, in some embodiments, the first electrode and a second electrode comprises an electronically conductive solid material.

In some embodiments, the first electrode and/or the second electrode comprises a metal or metal alloy. For example, in some cases, the first electrode and/or the second electrode is or comprises platinum. Other materials the first electrode and/or the second electrode may be or comprise include, but are not limited to, copper and silver. In certain embodiments, the first electrode and/or the second electrode is in the form of the thin film (e.g., disposed on, underneath, or next to the lithium titanate-containing domain). However in some embodiments, the first electrode and/or the second electrode are in the form of a wire (e.g., wires in contact with the lithium titanate-containing domain). The first electrode and the second electrode may be fabricated directly on to the resistive switching device (e.g., by PVD or other suitable techniques), or they may be fabricated separately and attached to the resistive switching device (e.g., via lamination). Additional or alternative fabrication steps may be used involving optical lithography, E-beam lithography, reactive ion etching and/or chemical wet etching.

Figure 1B:
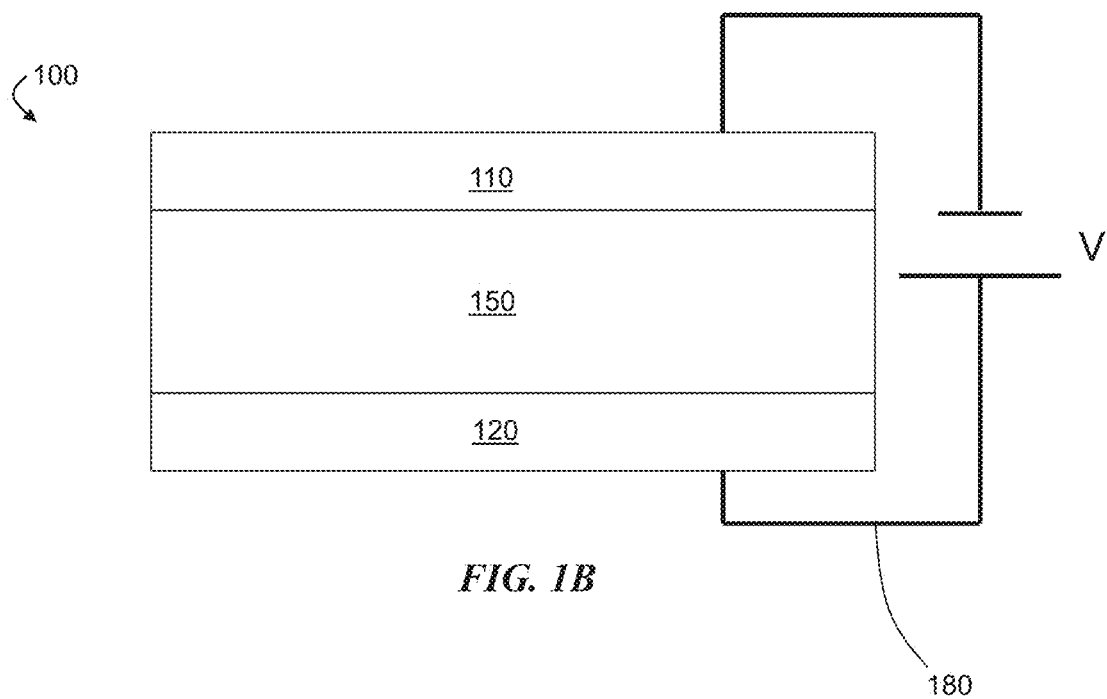
FIG. 1B shows a cross-sectional schematic diagram of an exemplary resistive switching device comprising a lithium titanate-containing domain and an electrical circuit, according to some embodiments.

In some embodiments, the first electrode and the second electrode are electronically coupled to each other. Having the first electrode be electronically coupled to the second electrode can provide for an ability for electrical current to flow from the first electrode to the second electrode (or vice versa). Referring to FIG. 1B, first electrode 110 is electronically coupled to second electrode 120, in accordance with certain embodiments. In some embodiments, the first electrode is electronically coupled to the second electrode via an external electrical circuit coupled to the resistive switching device. Referring again to FIG. 1B, in accordance with certain embodiments, first electrode 110 is electronically coupled to second electrode 120 via electrical circuit 180. Coupling the first electrode with the second electrode via an external electrical circuit may, in some cases, allow for an electrical potential (e.g., a voltage) to be applied to the resistive switching device (e.g., to change the resistance state of the lithium titanate-containing domain). In some embodiments, the first electrode and the second electrode are electronically coupled to each other even in the absence of an external electrical circuit coupled to the resistive switching device. For example, referring again to FIG. 1B, in some embodiments, first electrode 110 is electrically coupled to second electrode 120 even in the absence of external electrical circuit 180 (e.g., in cases in which electrical circuit 180 is interrupted), in accordance with certain embodiments. In some such cases, the first electrode is electronically coupled to the second electrode via the lithium titanate-containing domain (e.g., lithium titanate-containing domain 150). In some such embodiments, the first electrode serves as a source and the second electrode serves as a drain during operation of the resistive switching device, and electrical current can flow from the first electrode, through the lithium titanate-containing domain, and to the second electrode (e.g., so that the electrical current can be measured and/or the resistance and/or conductance of the lithium titanate-containing domain can be determined). In some embodiments, there is at least one pathway from the first electrode, through the lithium titanate-containing domain, and to the second electrode that does not pass through electronically insulating material.

Certain embodiments are related to methods of operating the resistive switching device. For example, in some embodiments, methods comprise applying an electrical potential to the resistive switching device. For example, as shown in FIG. 1B and in accordance with certain embodiments, an electrical potential V can be applied to exemplary resistive switching device 100 using external electrical circuit 180 (e.g., such that a voltage is applied across first electrode 110 and second electrode 120). Applying an electrical potential to a resistive switching device comprising a lithium titanate-containing domain as described herein may cause the lithium titanate-containing domain to undergo a change in resistance state. Changing the resistance state of the lithium-containing domain of the resistive switching device may allow the resistive switching device to be used in certain computing applications (e.g., for information storage, or neuromorphic processing).

In certain methods involving applying an electrical potential to the resistive switching device comprising a lithium titanate-containing domain, the method further comprises reducing the magnitude of the applied electrical potential. For example, some methods may comprise applying an electrical potential of at least +1 V, at least +2 V, at least +3 V, +4 V, or more (or alternatively, applying an electrical potential of −1 V, −2V, −3 V, −4 V, or less), followed by reducing the magnitude of the applied electrical potential (e.g., to a value closer to or equal to 0 V). Some embodiments comprise applying a positive electrical potential that is less than or equal to +5 V, less than or equal to +4.5 V, or less. Some embodiments comprise applying a negative electrical potential of greater than or equal to −5 V, greater than or equal to −4.5 V, or more. Combinations of these ranges are possible. In some embodiments, the lithium titanate-containing domain has a first electrical resistance prior to applying the electrical potential. In some such embodiments, the lithium titanate-containing domain has a second electrical resistance that is different from the first electrical resistance after the reducing of the magnitude of the applied electrical potential. In certain cases, the second electrical resistance is different from the first electrical resistance even when the step of reducing the magnitude of the applied electrical is completed (e.g., when the reducing the magnitude of the applied electrical potential is stopped such that the applied electrical potential is 0 V). As an example, the lithium titanate-containing domain may have a resistance of 100 ohms (the first resistance) prior to the application of an electrical potential (e.g., at an initial electrical potential of 0 V), then an electrical potential of +4 V is applied to the resistive switching device (thereby changing the resistance of the lithium titanate-containing domain), and then the applied electrical potential is reduced back to 0 V, at which point the lithium titanate-containing domain has a resistance of 10 ohms (the second resistance). In cases in which the resistive switching device is capable of having a first electrical resistance and second, different electrical resistance under the conditions described above, the resistive switching device may be considered to be in a first electrical resistance state when the lithium titanate-containing domain has the first electrical resistance, and the resistive switching device may be considered to be in a second electrical resistance state when the lithium titanate-containing domain has the second, different electrical resistance. The resistance state having a higher magnitude of resistance may be called a High Resistance State (HRS) or an "OFF-state", while the resistance state having a lower magnitude of resistance may be called a Low Resistance State (LRS) or an "ON-state". Having a first resistance state and a second resistance state as described above may manifest in an observable hysteresis in current-voltage curves acquired using the resistive switching device.

In some embodiments, the ratio of the electrical resistances described above of may be relatively large. Having a large ratio of electrical resistances (e.g., first resistance, second resistance) may allow for an easier distinction between resistance states of the resistive switching device (e.g., during reading of the memory in a computer information storage medium utilizing the resistive switching device). In some embodiments (e.g., when the resistive switching device is in a High Resistance State prior to the application of the electrical potential), the ratio of the first electrical resistance to the second electrical resistance is greater than or equal to 5, greater than or equal to 10, greater than or equal to 20, greater than or equal to 50, greater than or equal to 100, greater than or equal to $10^3$, greater than or equal to $10^4$ and/or less than or equal to $10^5$, less than or equal to $10^6$, or less than or equal to $10^7$. In some embodiments (e.g., when the resistive switching device is in a Low Resistance State prior to the application of the electrical potential), the ratio of the second electrical resistance to the first electrical resistance is greater than or equal to 5, greater than or equal to 10, greater than or equal to 20, greater than or equal to 50, greater than or equal to 100, greater than or equal to $10^3$, greater than or equal to $10^4$ and/or less than or equal to $10^5$, less than or equal to $10^6$, or less than or equal to $10^7$. The ratio of the electrical resistance in the High Resistance State to the resistance in the Low Resistance State may, in some cases, depend on the degree of lithiation of the lithium titanate-containing domain. In some embodiments, at least a portion of the lithium titanate-containing domain has a different structural phase when the lithium titanate-containing domain has the first electrical resistance (e.g., in a first electrical resistance state) than when the lithium titanate-containing domain has the second electrical resistance (e.g., in the second electrical resistance state). As a non-limiting example, when the lithium titanate-containing domain has the first electrical resistance (e.g., in the first electrical resistance state), at least a portion of the lithium titanate-containing domain may have a spinel structure with Li ions distributed in 8a positions, but when the lithium titanate-containing domain has the second resistance (e.g., in the second electrical resistance state), the at least a portion of the lithium titanate-containing domain may have a rock-salt structure, with Li ions populating mainly 16c positions. In other words, changing the resistance (e.g., resistance state) of the lithium titanate-containing domain (e.g., by applying an electrical potential to the resistive switching device) may involve causing at least a portion of the lithium titanate-containing domain to undergo a phase change. In some embodiments, applying an electrical potential causes the lithium titanate-containing domain to undergo a phase segregation. The electric-field induced phase segregation may result in a portion of the lithium titanate-containing domain being one phase of lithium titanate (e.g., $Li_4Ti_5O_{12}$) and another portion of the lithium titanate-containing domain being a different phase of lithium titanate (e.g., $Li_7Ti_5O_{12}$). In some cases, an electric field (e.g., caused by applying the electrical potential) may cause some Li ions to migrate within the lithium titanate-containing domain (e.g., from 8a positions in a spinel structure to 16c positions in a rock-salt structure), thereby causing a change in resistance (e.g., resistance state) and a change in a structural phase of at least part of the lithium titanate-containing domain. In some embodiments, at least 1 volume percent (vol %), at least 10 vol %, at least 25 vol %, at least 50 vol %, at least 75 vol %, at least 90 vol %, at least 95 vol %, at least 99 vol %, or up to 100 vol % of the lithium titanate-containing domain has a different structural phase when the lithium titanate-containing domain has the first resistance (e.g., in the first resistance state) than when the lithium-titanate-containing domain has the second resistance (e.g., in the second resistance state). In some instances in which applying an electric field causes a phase segregation in the lithium titanate-containing domain such that a portion of the lithium titanate-containing domain is $Li_4Ti_5O_{12}$ and a portion of the lithium titanate-containing domain is $Li_7Ti_5O_{12}$, the portion that is $Li_7Ti_5O_{12}$ is part of an electronically conductive filament comprising $Li_7Ti_5O_{12}$. Without wishing to be bound by any particular theory, the presence of an electronically conductive filament in the lithium titanate-domain may contribute to a change in resistance state of the lithium titanate-containing domain (e.g., a change to a low resistance state).

The structural phase of the lithium titanate-containing domain may be measured, for example, using X-ray diffraction and/or Raman vibrational spectroscopy.

In some embodiments, there is a relatively small difference in volume of the lithium titanate-containing domain when the lithium titanate-containing domain has the first electrical resistance (e.g., in the first electrical resistance state) compared to when the lithium titanate has the second electrical resistance (e.g., in the second electrical resistance state). In certain cases, the volume of the lithium titanate-containing domain undergoes a change of less than or equal to 2%, less than or equal to 1%, less than or equal to 0.2%, less than or equal to 0.1%, or less upon changing from having the first resistance (e.g., being in the first resistance state) to having the second resistance (e.g., being in the second resistance state). It should be noted that the percentage changes described herein are calculated relative to the smaller of the two values. For example, both a change in volume from 1.01 mm$^3$ to 1.00 mm$^3$ and a change in volume from 1.00 mm$^3$ to 1.01 mm$^3$ are changes of 1%. A low difference in volume of the lithium titanate-containing domain between the first electrical resistance state and the second electrical resistance state may occur in instances where changes in electrical resistance state are due to phase changes in certain portions of the domain from a $Li_4Ti_5O_{12}$ phase to a $Li_7Ti_5O_{12}$ phase or vice versa. It is believed that the small interatomic distances between the 8a sites filled in the $Li_4Ti_5O_{12}$ phase and the 16c sites filled in the $Li_7Ti_5O_{12}$ phase contribute to the small change in volume and consequent low strain upon phase change. A low strain (e.g., zero-strain) between electrical resistance states can, in some instances, be beneficial for resistive switching devices for which chemo-mechanical deformation during switching can be damaging. The volume of the lithium titanate-containing domain may be calculated, for example, using images taken using scanning electron microscopy (SEM).

Some methods described herein may further comprise determining an electrical resistance or conductance of the resistive switching device. In some cases, determining an electrical resistance or conductance of the resistive switching device (e.g., either before or after the application of an electrical potential across the resistive switching device) may be performed in order to determine whether the resistive switching device is in a High Resistance State or a Low Resistance State. Such a determination may be part of a computer process (e.g., reading of computer memory or storage utilizing memristors based on the resistive switching devices described herein).

In some embodiments, the lithium titanate-containing domain has a first side and a second side. Referring again to FIG. 1A, lithium-containing domain 150 has first side 151 and second side 152. In some embodiments, the first electrode is in contact with the first side of the lithium titanate-containing domain, and the second electrode is in contact with the second side of the lithium titanate-containing domain. For example, in FIG. 1A, first electrode 110 is in contact with first side 151, and second electrode 120 is in contact with second side 152, in accordance with certain embodiments. Such an arrangement in which the first electrode is in contact with the first side and the second electrode is in contact with the second side may be useful in cases in which it is desirable to operate the resistive switching device in a cross-plane configuration (e.g., in cases where the lithium titanate-containing domain establishes a plane, and an electric field perpendicular to the plane causes migration of Li ions in a direction perpendicular to that plane).

Figure 2:
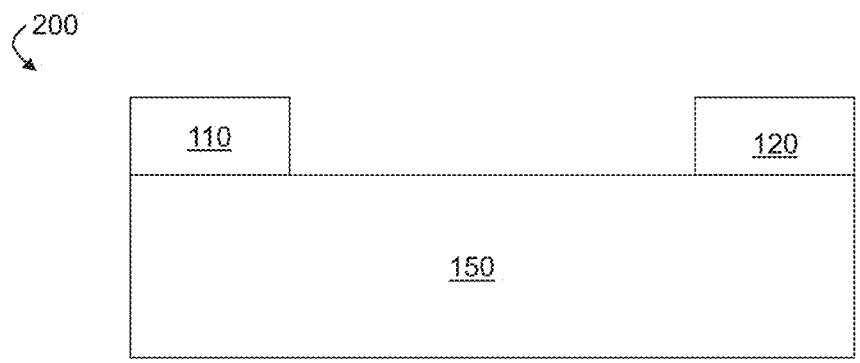
FIG. 2 shows a cross-sectional schematic diagram of an exemplary resistive switching device comprising a lithium titanate-containing domain, a first electrode, and a second electrode, according to some embodiments.
Figure 3:
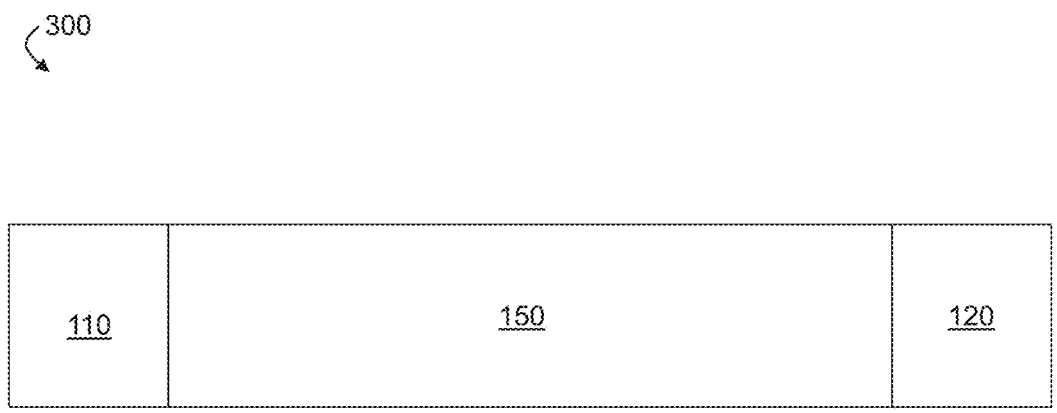
FIG. 3 shows a cross-sectional schematic diagram of an exemplary resistive switching device comprising a lithium titanate-containing domain, a first electrode, and a second electrode, according to some embodiments.

In some embodiments, both the first electrode and the second electrode are in contact with a same side of the lithium titanate-containing domain. Referring to FIG. 2, resistive switching device 200 comprises lithium titanate-containing domain 150, first electrode 110, and second electrode 120, and first electrode 110 and second electrode 120 are on the same side of lithium titanate-containing domain 150. Such an arrangement in which the first electrode and the second electrode are in contact with the same side of the lithium titanate-containing domain may be useful in cases in which it is desirable to operate the resistive switching device in an in-plane configuration (e.g., in cases where the lithium titanate-containing domain establishes a plane, and an electric field parallel with the plane causes migration of Li ions within that plane). FIG. 3 shows an alternate arrangement of the first electrode and the second electrode, in which first electrode 110 and second electrode 120 of resistive switching device 300 are not in contact with the same side of lithium titanate-containing domain 150, but where an in-plane configuration is still employed for the resistive switching device, in accordance with certain embodiments.

Figure 4A:
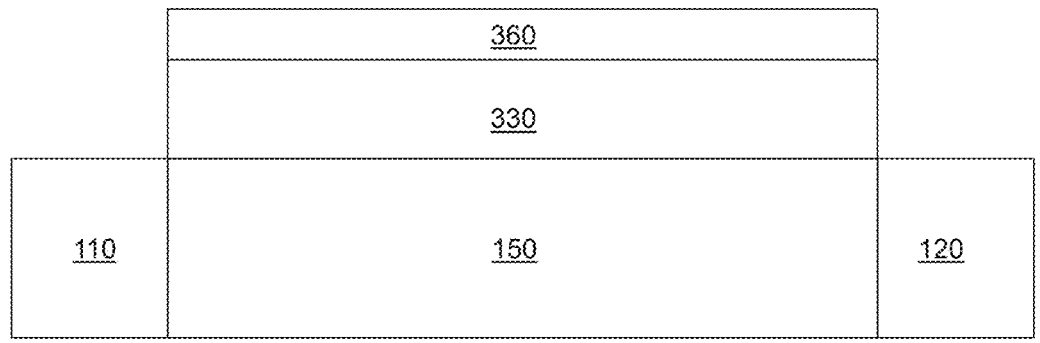
FIG. 4A shows a cross-sectional schematic diagram of an exemplary resistive switching device comprising a lithium titanate-containing domain, a solid lithium ion source, and a solid lithium-conducting electrolyte domain, according to some embodiments.

In some embodiments, the resistive switching device further comprises a solid lithium ion source. Referring to FIG. 4A, in some embodiments, resistive switching device 400 comprises solid lithium ion source 360. In some embodiments, the resistive switching device further comprises a solid lithium ion source disposed on a solid lithium-conducting electrolyte (described below). Referring again to FIG. 4A, in some embodiments, resistive switching device 400 comprises solid lithium ion source 360 disposed on solid lithium-conducting electrolyte domain 330, which is disposed on lithium titanate-containing domain 150. In some embodiments, the solid lithium ion source is or comprises lithium metal and/or a lithium alloy. In some embodiments, the solid lithium ion source is a Li intercalation compound. For example, in some cases, the solid lithium ion source is a Li metal oxide. In some cases, the solid lithium ion source is a Li cobalt oxide (LCO) (e.g., $LiCoO_2$). In some embodiments, the solid lithium ion source is a film. For example, in some cases, the solid lithium ion source is a thin film.

In some embodiments, the resistive switching device further comprises a solid lithium-conducting electrolyte domain between the lithium titanate-containing domain and the solid lithium ion source. Referring to FIG. 4A, exemplary resistive switching device 400 comprises solid lithium-conducting electrolyte domain 330 between lithium titanate-containing domain 150 and solid lithium source 360. In some embodiments, the resistive switching device comprises a solid lithium ion source disposed on the solid lithium-conducting electrolyte. Referring again to FIG. 4A, in some embodiments, resistive switching device 400 comprises solid lithium ion source 360 disposed on solid lithium-conducting electrolyte domain 330, which is disposed on lithium titanate-containing domain 150. The solid lithium-conducting electrolyte domain may comprise any suitable solid having a relatively high lithium ion conductivity and relatively low electronic conductivity. In some embodiments, the solid lithium-conducting electrolyte domain comprises a lithium-containing ceramic. In some cases, the solid lithium-conducting electrolyte domain comprises a lithium-containing garnet. In some embodiments, the lithium-conducting electrolyte domain is a garnet that comprises lithium, lanthanum, zirconium, and oxygen. In some such cases, the lithium-conducting electrolyte domain comprises a material having a chemical formula of $Li_7La_3ZrO_{12}$. In some, but not necessarily all cases, it may be useful to use $Li_7La_3ZrO_{12}$ as a solid lithium-conducting electrolyte in resistive switching devices instead of other materials such as lithium phosphorus oxynitride (LIPON), because $Li_7La_3ZrO_{12}$ conducts Li ions up to two orders of magnitude faster than LIPON, while having a wider electrochemical window. Some such cases may include nanoelectronic applications. Solid lithium-conducting electrolytes may, in some cases, be fabricated using the PVD methods described above, with an appropriate target comprising lithium, lanthanum, zirconium, and oxygen. Certain methods involving the use of a second PVD target comprising lithium and nitrogen (e.g., a lithium nitride such as $Li_3N$) may result in the formation a stable thin film of the highly conductive cubic state of phase of the lithium lanthanum zirconium oxygen garnet (LLZO) garnet). In some embodiments, the solid lithium-conducting electrolyte is a film. For example, in some embodiments, the solid lithium-conducting electrolyte is a thin film.

Figure 4B:
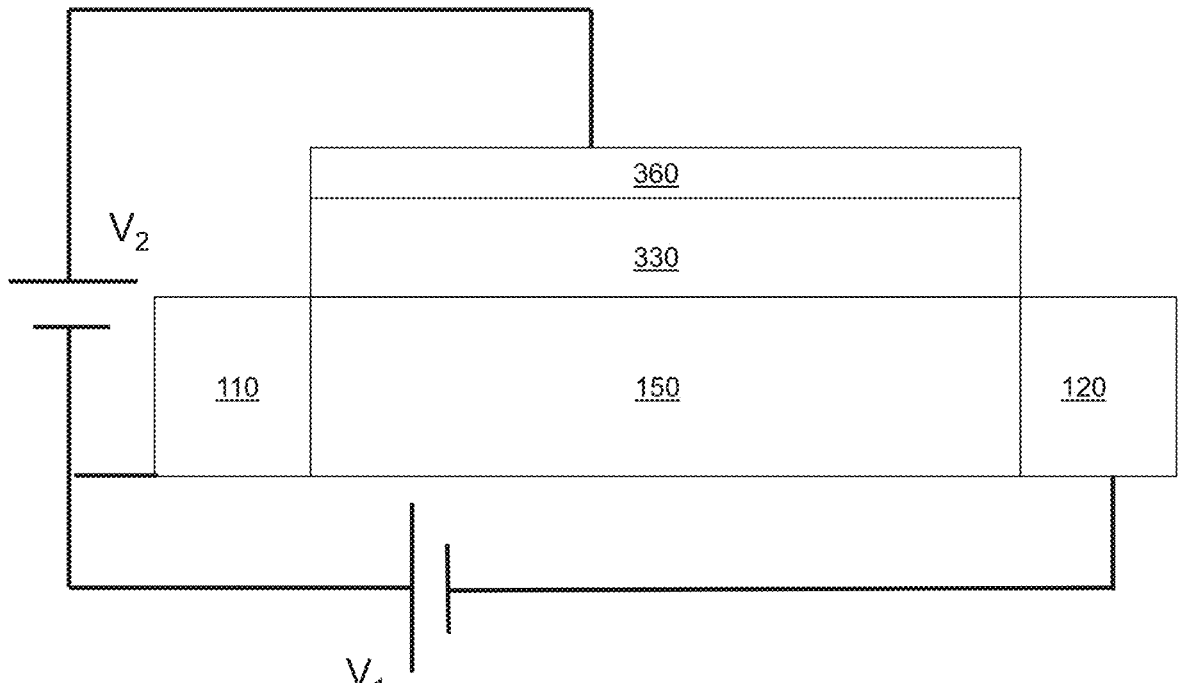
FIG. 4B shows a cross-sectional schematic diagram of an exemplary resistive switching device comprising a lithium titanate-containing domain, a solid lithium ion source, a solid lithium-conducting electrolyte domain, and an electrical circuit, according to some embodiments.

In some embodiments, the electrical potential applied to the resistive switching device described above is a first electrical potential across the first electrode set. Referring to FIG. 4B, in some embodiments, the electrical potential applied to resistive switching device 400 is first electrical potential $V_1$ applied across a first electrode set comprising first electrode 110 and second electrode 120. In some cases, the method further comprises applying a second electrical potential across a second electrode set. Referring again to FIG. 4B, in some embodiments, a second electrical potential is applied across a second electrode set comprising solid lithium ion source 360 (or an electrode electronically coupled to solid lithium ion source 360) as well as first electrode 110 and/or second electrode 120. Such an arrangement and method may be useful, for example, in certain cases in which the resistive switching device is a 3-terminal resistive switching device (e.g., a hybrid memristor-nano-battery device), where the second electrical potential is a gate voltage. In some embodiments, applying the second electrical potential across the second electrode set is performed such that Li ions are intercalated into or deintercalated from the lithium titanate-containing domain. For example, in FIG. 4B, applying second electrical potential $V_2$ causes Li ions to intercalate into or deintercalate from lithium titanate-containing domain 150. In certain cases, applying second electrical potential $V_2$ causes at least a portion of the intercalated or deintercalated Li ions to cross an interface between the lithium titanate-containing domain and the solid lithium-conducting electrolyte domain. In FIG. 4B, applying the second electrical potential causes Li ions to intercalate into lithium titanate-containing domain 150 by migrating from solid lithium-conducting electrolyte domain 330 across the interface between lithium titanate-containing domain 150 and solid lithium-conducting electrolyte domain 330 (e.g., due to the electrical field created by applying the second electrical potential), in accordance with certain embodiments. Similarly, in some embodiments, applying the second electrical potential causes Li ions to deintercalate from lithium titanate-containing domain 150 and migrate across the interface between lithium titanate-containing domain 150 and solid lithium-conducting domain 330, in accordance with certain embodiments. In some cases, at least some of the Li ions intercalated into the lithium titanate-containing domain originate in the solid lithium ion source (e.g., a layer of lithium metal or metal alloy or a layer of lithium intercalation compound such as lithium cobalt oxide), and pass from the solid lithium ion source, through the solid lithium-conducting electrolyte domain, and into the lithium titanate-containing domain. In such a way, the solid lithium ion source (e.g., lithium metal, lithium intercalation material such as a Li cobalt oxide) working in tandem with the solid lithium-conducting electrolyte domain may serve as a "lithium pump" when used in the "3-terminal" configuration described above and shown in FIG. 4B, in accordance with certain embodiments. In some cases, the resistive switching device described herein may be used as a transistor. In some cases, the resistive switching device described herein may be used as a Li-ion synaptic transistor for analog computation (LISTA), with improved performance in some cases due to the relatively high Li-ion conductivity and low electrochemical window of lithium titanate compared to similar technologies using conventional materials (e.g., Li cobalt oxides).

Figure 4C:
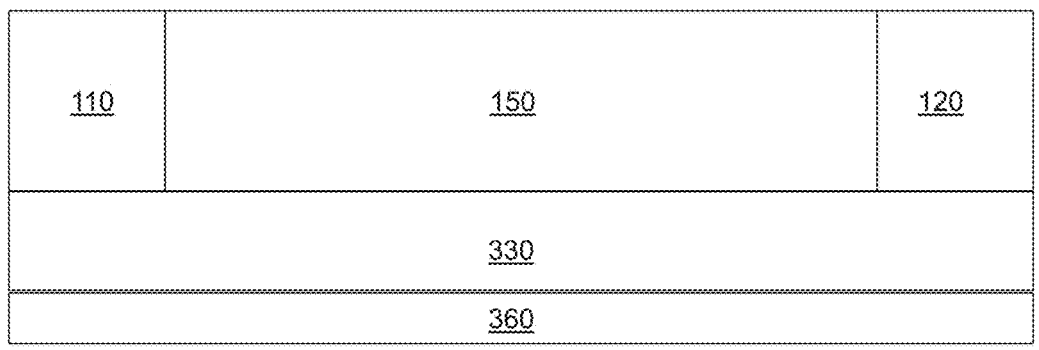
FIG. 4C shows a cross-sectional schematic diagram of an exemplary resistive switching device comprising a lithium titanate-containing domain, a solid lithium ion source, and a solid lithium-conducting electrolyte domain, according to some embodiments.
Figure 4D:
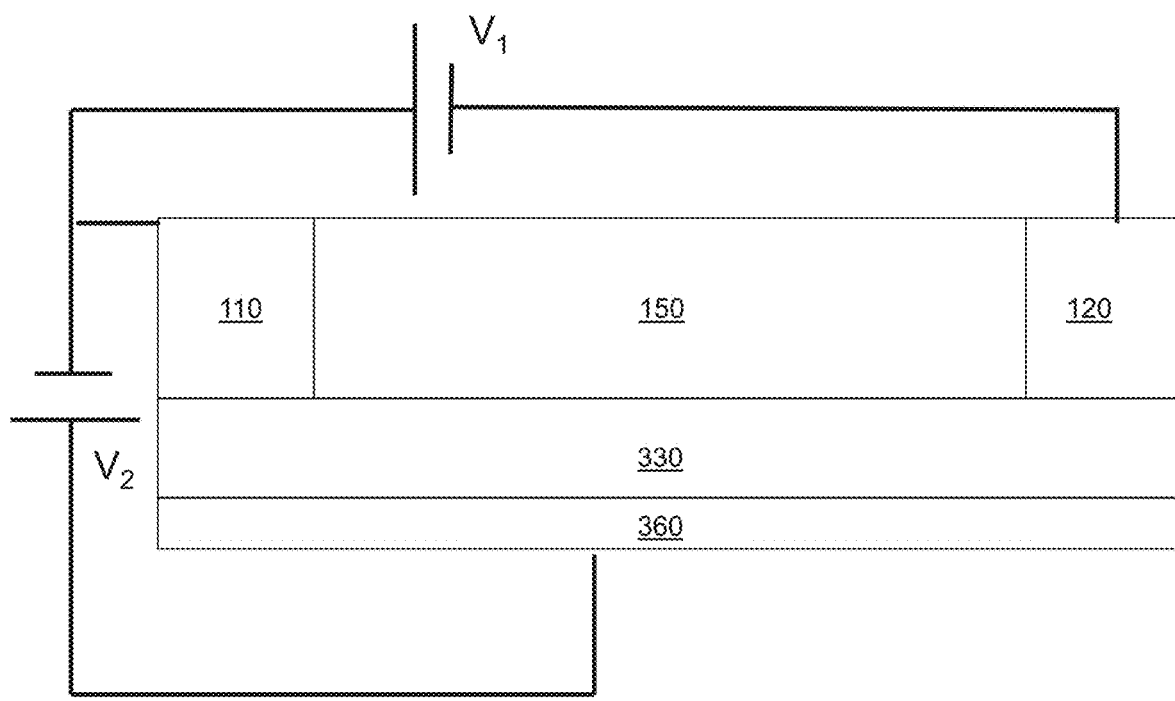
FIG. 4D shows a cross-sectional schematic diagram of an exemplary resistive switching device comprising a lithium titanate-containing domain, a solid lithium ion source, a solid lithium-conducting electrolyte domain, and an electrical circuit, according to some embodiments.

It should be understood that some embodiments in which the resistive switching device comprises a solid lithium-conducting electrolyte domain between the lithium titanate-containing domain and a solid lithium ion source may have a configuration that is different than the configuration shown in FIGS. 4A and 4B. In some cases, the resistive switching device comprises a "buried" solid lithium ion source. For example, in some cases, the resistive switching device is arranged as shown in FIGS. 4C and 4D. FIG. 4C depicts exemplary resistive switching device 500, where solid lithium-conducting electrolyte domain 330 between lithium titanate-containing domain 150 and solid lithium ion source 360 is positioned underneath lithium titanate-containing domain 150 in the figure, and solid lithium ion source 360 is underneath solid lithium-conducting electrolyte domain 330 in the figure. FIG. 4D shows an exemplary illustration of a possible "3-terminal" circuit using exemplary resistive switching device 500.

Figure 4E:
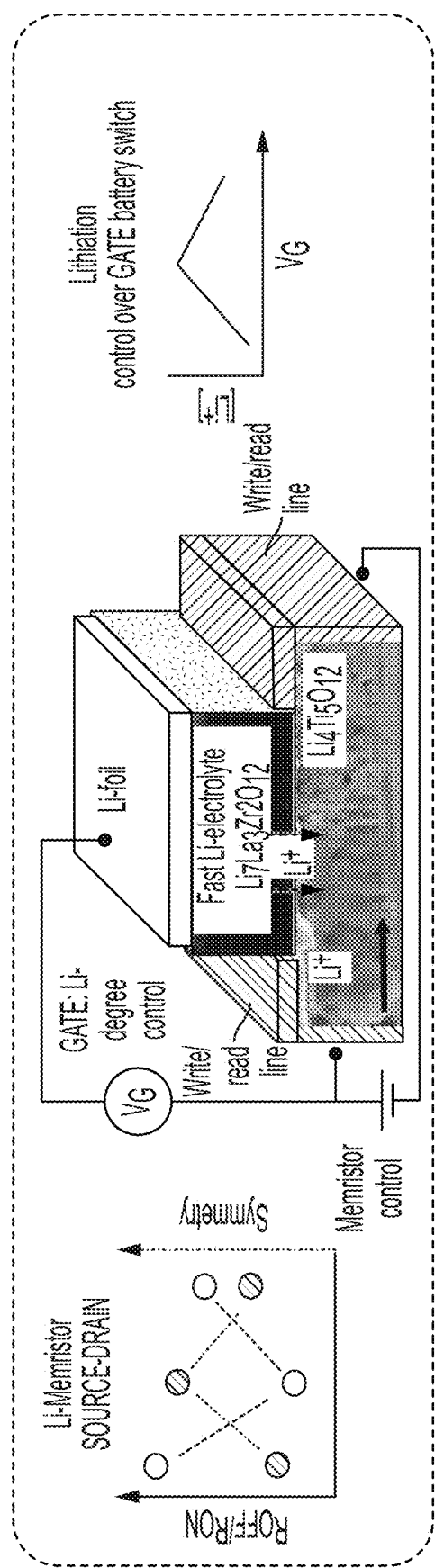
FIG. 4E shows a cross-sectional schematic diagram of an exemplary resistive switching device comprising a lithium titanate-containing domain comprising $Li_4Ti_5O_{12}$, lithium foil as a solid lithium ion source, a solid lithium-conducting electrolyte domain comprising $Li_7La_3Zr_2O_{12}$, and associated electrical circuitry and illustrative plots of resistance windows, symmetry, and lithiation as a function of gate voltage, according to some embodiments.

FIG. 4E shows a cross-sectional schematic diagram of a resistive switching device according to one embodiment. The resistive switching device in FIG. 4E comprises a lithium titanate-containing domain comprising $Li_4Ti_5O_{12}$. The resistive switching device further comprises a solid lithium-conducting electrolyte domain comprising $Li_7La_3Zr_2O_{12}$ disposed on the lithium titanate-containing domain, and a lithium foil solid lithium ion source disposed on the solid lithium-conducting electrolyte domain. As mentioned above, in some embodiments a resistive switching device comprises a first electrode set and a second electrode set. For example, the embodiment in FIG. 4E comprises a first electrode set comprising write/read lines (e.g., made of platinum metal) and associated circuitry configured for memristor control, and a second electrode set comprising a read/write line and the lithium foil and associated circuitry configured for application of a gate voltage, $V_G$. In some instances, application of the gate voltage can control the lithiation of the lithium titanate-containing domain, as shown in the illustrative plot on the far right side of FIG. 4E (e.g., due to migration of $Li^+$ to and from the lithium titanate-containing domain and the lithium foil via the $Li_7La_3Zr_2O_{12}$). Application of the gate voltage may result in changes in resistive switching properties of the lithium titanate-containing domain. For example, applying the gate voltage may allow for control of the resistance window and/or symmetry of the lithium titanate-containing domain, as shown in the illustrative plot on the far left side of FIG. 4E. The embodiment shown in FIG. 4E may be fabricated, for example, using physical vapor deposition techniques such as pulsed laser deposition.

It should be understood that when a structure is referred to as being "on", "over", "under", "on top of", or "underneath", another structure, these terms are used to indicate relative positioning of the structures, and that the terms are meant to be used in such a way that the relative positioning of the structures is independent of the orientation of the combined structures or the vantage point of an observer. Additionally, it should also be understood that when a structure is referred to as being "on" or "over" another structure, it may cover the entire structure, or a portion of the structure. Similarly, it should be understood that when a structure is referred to as being "under" another structure, it may be covered by the entire structure, or a portion of the structure.

In addition, when a first structure is referred to as being "on," "over," or "on top of" a second structure, the first structure can be directly on the second structure, or an intervening structure (e.g., a layer, a gap) also may be present between the first structure and the second structure. Similarly, when a first structure is "under" or "underneath" a second structure, the first structure can be directly under the second structure, or an intervening structure (e.g., a layer, a gap) also may be present between the first structure and the second structure. A first structure that is "directly on," "directly under," or "in direct contact with" a second structure means that no intervening structure is present between the first structure and the second structure.

In some embodiments, the intercalation of Li ions into or deintercalation of Li ions from the lithium titanate-containing domain causes a change in the value of at least one resistive switching property of the lithium titanate-containing domain. In such a way, the properties of the resistive switching device may tunable (e.g., by applying the second electrical potential described above as a gate voltage to tune the resistive switching properties). In certain, but not necessarily all cases, such an ability to tune the resistive switching properties of the resistive switching device (e.g., by lithium ion intercalation/deintercalation) may provide certain advantages. Some such advantages may include an ability to change functionality of the resistive switching device in an in situ manner (e.g., from a lower lithiation configuration suitable for multilevel information storage, where a high non-linear response and high resistance ratio (e.g., up to six orders of magnitude or more) may be beneficial, to a higher lithiation configuration suitable for a neuromorphic-like behavior, where a more symmetric response, and a lower resistance ratio (e.g., up to two orders of magnitude) may be beneficial).

Exemplary resistive switching properties include, but are not limited to, the resistance ratio (described above), symmetry, retention, endurance, sensitivity, switching speed, and Li ion diffusion rate. Examples of measurements of some such properties are described in the examples below. In some embodiments, the intercalation of Li ions into or deintercalation of Li ions from the lithium titanate-containing domain causes a change of at least 10%, at least 20%, at least 50%, at least 100%, at least 500%, at least 1000%, and/or up to a 10,000% change (determined relative to the value having the smaller magnitude) in the value of at least one resistive switching property of the lithium titanate-containing domain chosen from resistance ratio, symmetry, retention, endurance, sensitivity, switching speed, and Li ion diffusion rate, compared to the value before the intercalation of Li ions into or deintercalation of Li ions from the lithium titanate-containing domain.

U.S. Provisional Application No. 62/809,120, filed Feb. 22, 2019, and entitled "Resistive Switching Devices Containing Lithium Titanate, and Associated Systems and Methods," is incorporated herein by reference in its entirety for all purposes.

The following examples are intended to illustrate certain embodiments of the present invention, but do not exemplify the full scope of the invention.

EXAMPLE 1

In this example and in examples below, the resistive switching characteristics of lithium titanate compounds having of the general formula $Li_{4+3x}Ti_5O_{12}$ having two distinct Li contents were fabricated and analyzed in order to assess how the lithiation degree affects the resistive switching characteristics and parameters. Exemplary resistive switching characteristics and parameters (e.g., resistive switching properties) included, but were not limited to, accessible resistance window, diffusivity, retention and response to electrical pulses. Pulsed Laser Deposition (PLD) was chosen as the growth technique for the design of the Li titanates memristive devices. Lithiation degree was controlled using two different PLD techniques. It should be understood that employing any vacuum technique for deposition of Li-based oxide thin films poses the concern of Li-loss during deposition, due to the large volatility of $Li^+$ under the exposure to high energy and temperature. Typically, PLD or RF-Sputtering targets require a certain amount of Li-overlithiation above the stoichiometry prior to any thermal treatments (usually +10 wt.-% regarding nominal Li-stoichiometry) in order to achieve a proper Li-transfer onto the thin film. However, because an aim of these examples was to finely control the final lithiation degree in the thin film, overlithiation of the PLD target was not a proper strategy, because the density achieved of overlithiated targets usually remained low (e.g., <80%), producing thin films with poor deposition quality. Additionally, particle ablation from an overlithiated, but too porous, target leads to pinholes and structural inhomogeneities, which would be detrimental for device reproducibility and reliability, two important characteristics for the memristive community. Generally speaking, lithiation degree of thin films is difficult to measure and quantitatively difficult to access by classical lab equipment, and therefore normally rarely reported. The strategy employed in this example to overcome the Lithium loss issue for thin film deposition by PLD involved a sequential deposition of $Li_3N$ and Li-based oxide sources. Upon a post annealing step (or for deposition at medium temperature) $Li_3N$ decomposed and lithium diffused into the oxide structure, assuring sufficient overlithiation in the film. In other words, $Li_3N$ was selected as a source providing an internal Li-reservoir during annealing to compensate and tune the lithiation degree in Li-titanates films to study its influence on the memristive properties of the devices.

Thin Film Fabrication and Characterization

Figure 5B:
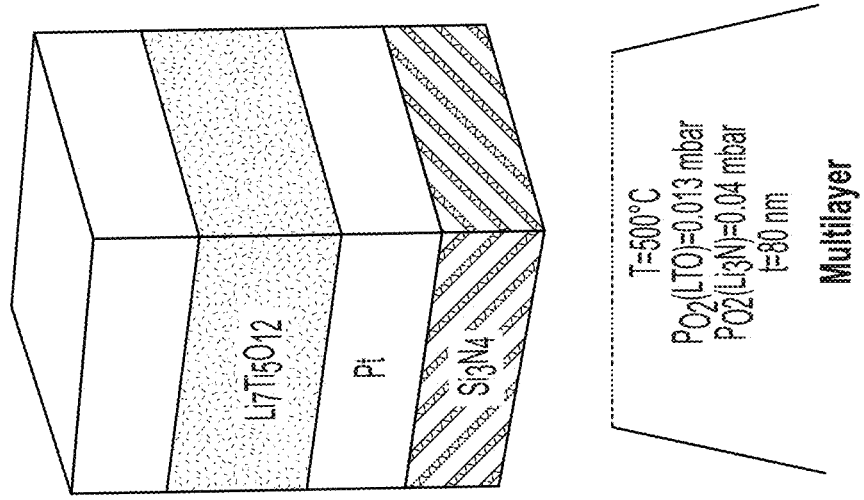
FIG. 5B shows a schematic illustration of a memristive device comprising a lithium titanate-containing domain comprising $Li_7Ti_5O_{12}$, according to some embodiments.
Figure 5A:
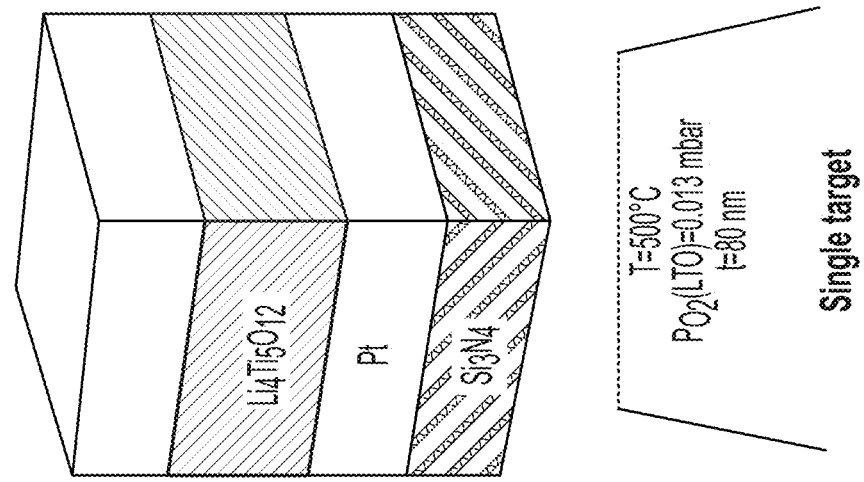
FIG. 5A shows a schematic illustration of a memristive device comprising a lithium titanate-containing domain comprising $Li_4Ti_5O_{12}$, according to some embodiments.

This example describes fabrication of certain memristive device units as non-limiting examples of resistive switching devices. Memristive device units were fabricated by employing two different strategies. FIG. 5A depicts a schematic illustration of a memristive device fabricated using the first strategy, which employed a single target deposition from an overlithiated pulsed laser deposition (PLD) target, the target having a nominal composition $Li_{7.1}Ti_5O_{12}$. FIG. 5B depicts a schematic illustration of a memristive device fabricated using the second strategy, which employed growing thin film multilayers of repeating layer sequences of $Li_3N$ and $Li_7Ti_5O_{12}$, keeping a ratio of 1:2 with respect to the film thickness. The depositions were performed using a PLD instrument equipped with a KrF excimer laser of 248 nm wavelength. The KrF excimer laser was operated at a repetition rate frequency and oxygen partial pressure of 5 Hz and 0.04 mbar, respectively, when using the $Li_3N$ target, and was operated at a repetition rate frequency and oxygen partial pressure of 10 Hz and 0.013 mbar, respectively when using the $Li_7Ti_5O_{12}$ target. Both PLD targets were thoroughly polished prior to transfer into the vacuum chamber of the PLD instrument. For each of the two different strategies (single target and multilayer), the temperature of the widely-available Pt-coated (200 nm) $Si_3N_4$/Si substrates was kept at 500° C. This process resulted in the formation of 80 nm-thick films. The fabrication of the memristive device units further included the deposition of Pt top electrodes by DC-Sputtering (50-500 µm range) through a shadow mask.

Figure 5C:
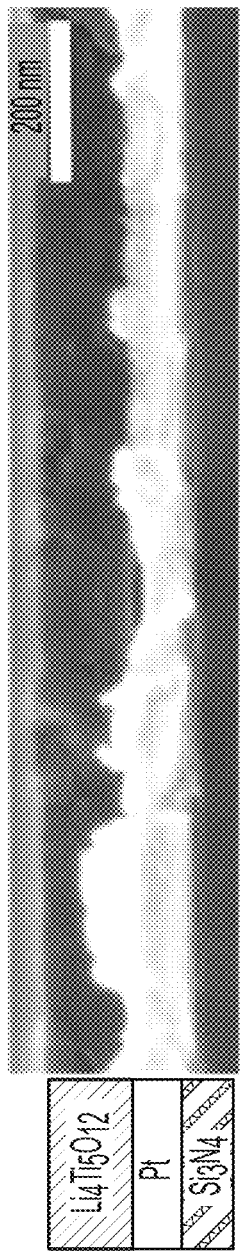
FIG. 5C shows a cross-sectional scanning electron microscopy (SEM) image of a single target-deposited 200 nm film, according to some embodiments.
Figure 5D:
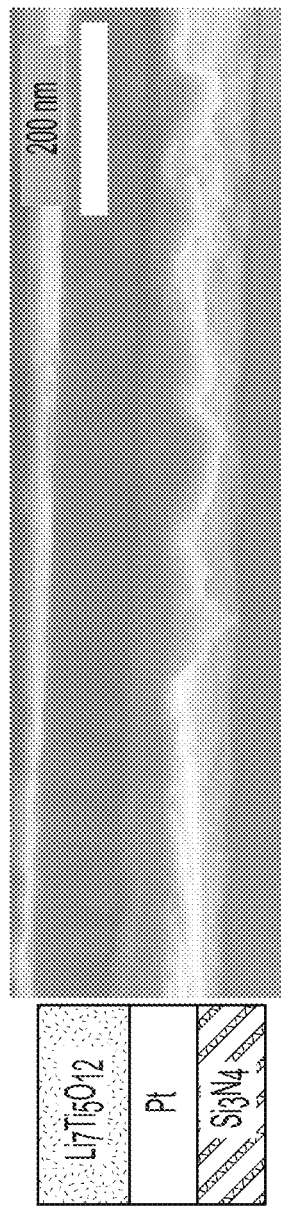
FIG. 5D shows a cross-sectional SEM image of a multi-layer deposited film, according to some embodiments.
Figure 5E:
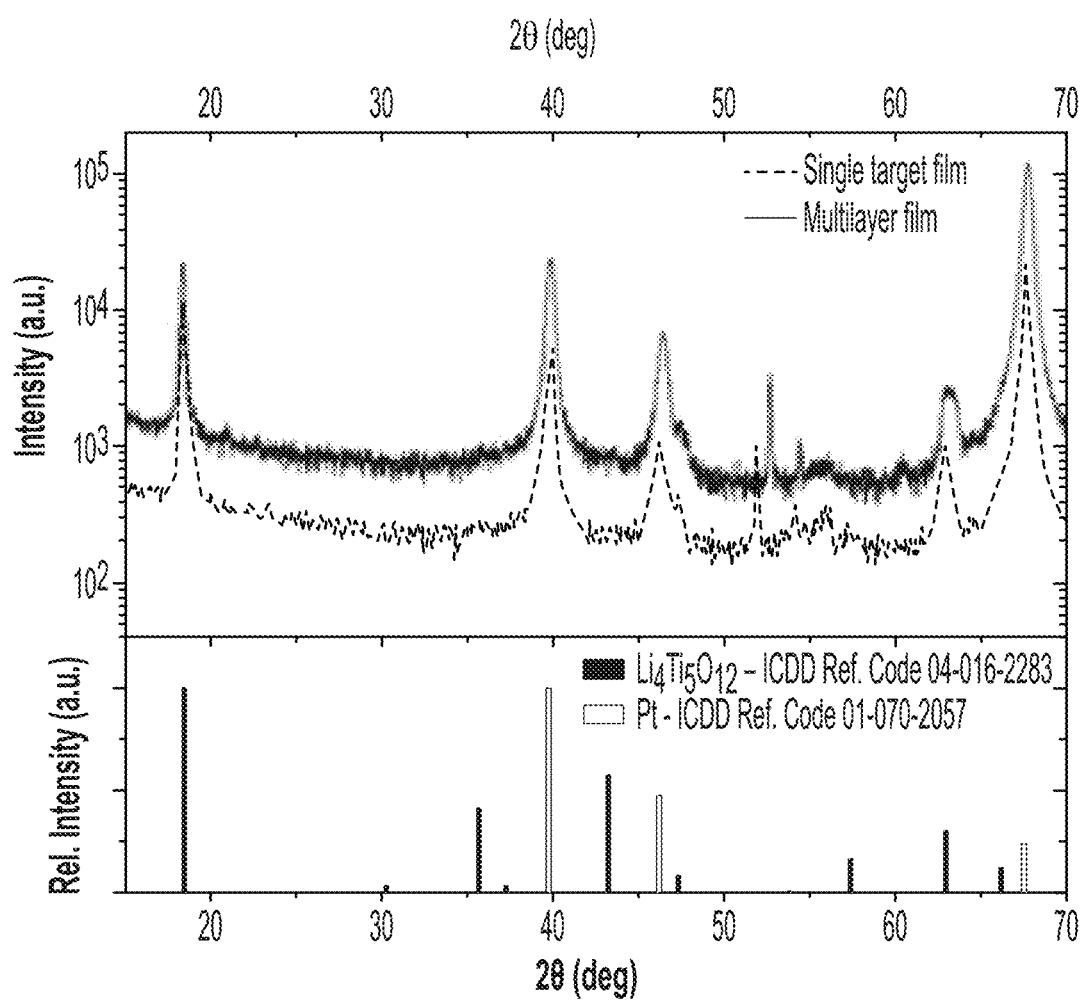
FIG. 5E shows grazing incident X-ray diffraction of lithium titanate films, according to some embodiments.
Figure 5F:
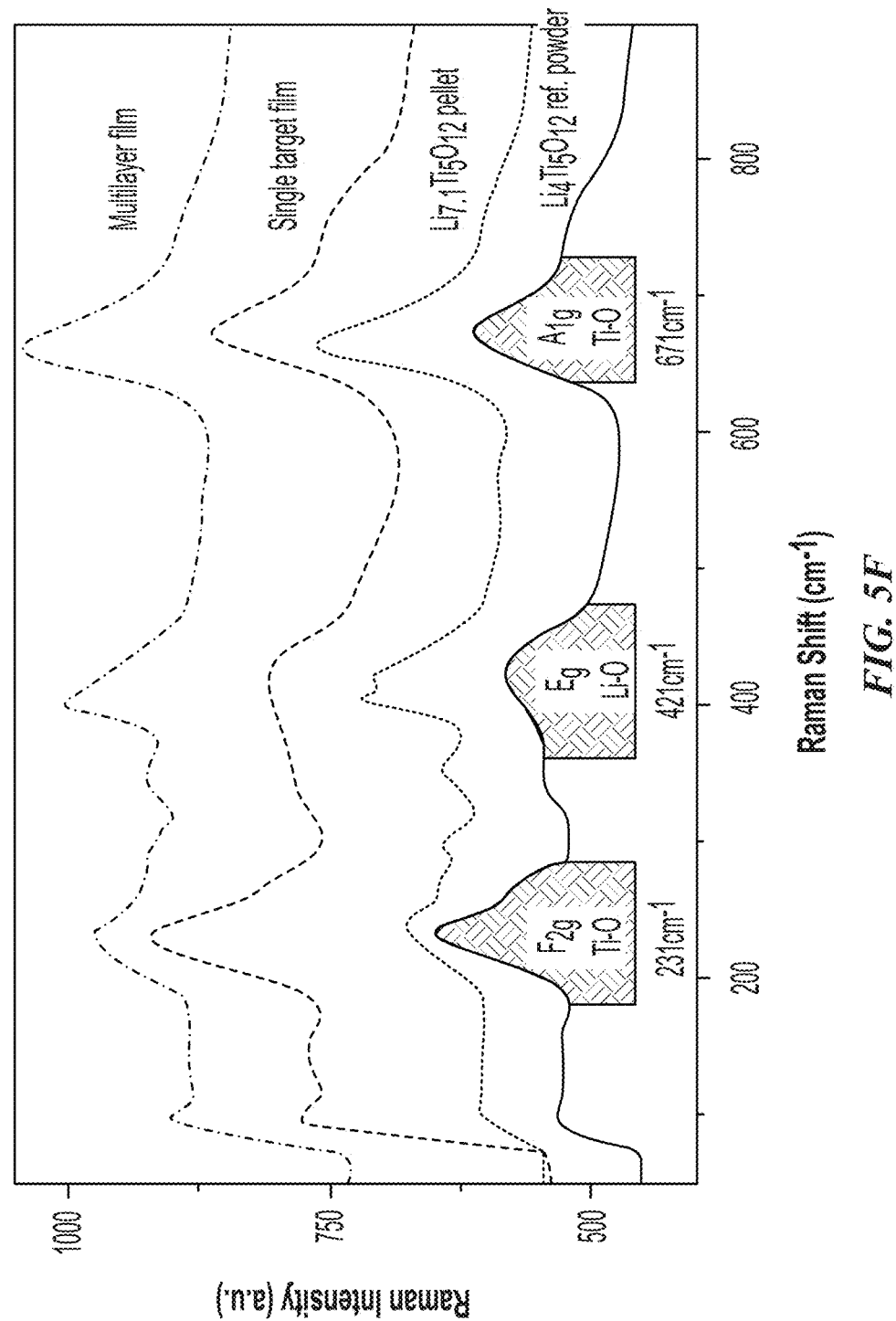
FIG. 5F shows Raman vibrational spectroscopy data for lithium titanate films, according to some embodiments.

The thin film microstructure and crystallinity of the memristive device units were then assessed. FIG. 5C shows a cross-sectional scanning electron microscopy (SEM) image of a single target-deposited 200 nm film, with the image showing a dense, flat and continuous layer, with no evidences of porosity. FIG. 5D shows a cross-sectional SEM image of a multilayer deposited film. In this case, a dense, flat and continuous layer with no observable porosity is obtained as well. The phase analysis of the films was performed by grazing incident X-ray diffraction (XRD) (FIG. 5E) and Raman vibrational spectroscopy (FIG. 5F). Both single target and multilayer films showed a very similar XRD pattern with no secondary phases, other than the appearance of the Si substrate (311) reflection around $2\Theta=55°$. For comparison, FIG. 5E displays reference patterns for $Li_4Ti_5O_{12}$ and Pt as well. The peak match between both films and the references suggested that no secondary phases were formed due to the $Li_3N$ in the multilayer case, and the targeted lithium titanate phase was successfully formed at 500° C.

Figure 5G:
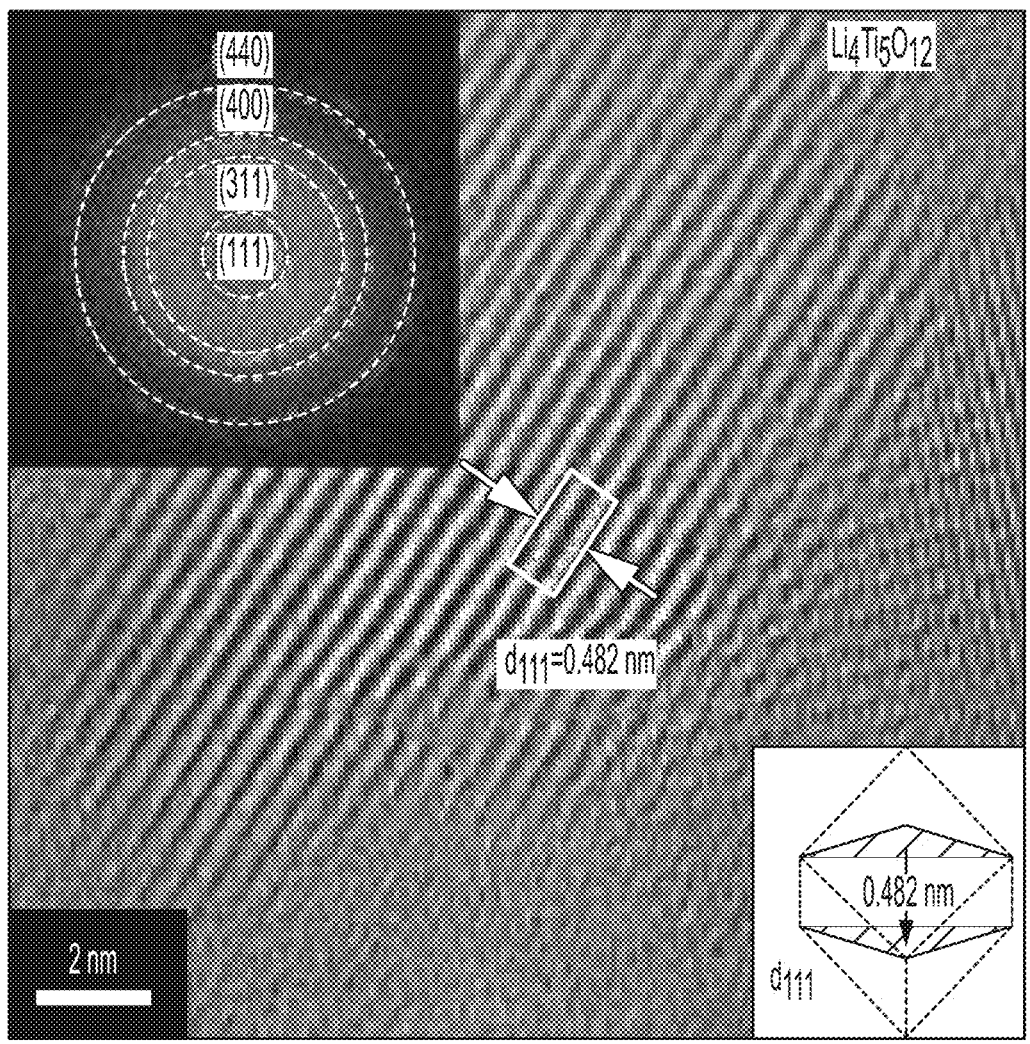
FIG. 5G shows a high resolution transmission electron microscopy image of a single target-deposited film with a fast Fourier transform as an inset, according to some embodiments.
Figure 5H:
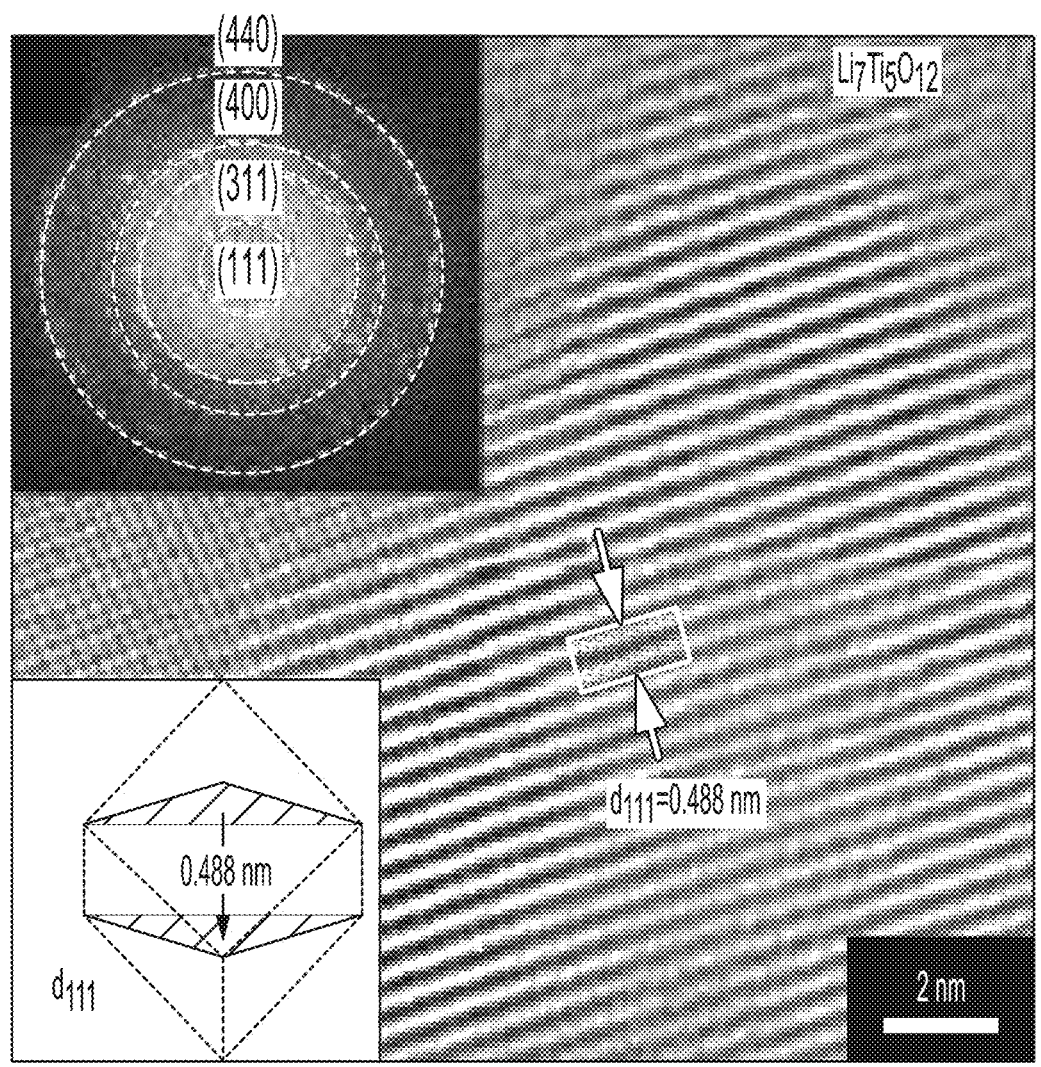
FIG. 5H shows a high resolution transmission electron microscopy image of a multilayer deposited film with a fast Fourier transform as an inset, according to some embodiments.

To gain further insight into the macroscopic and structural differences between a single target-deposited film and a multilayer deposited film for the switching devices, high resolution transmission electron microscopy (HRTEM) was used. FIG. 5G and FIG. 5H show the HRTEM images and reduced fast Fourier transforms (inset) for the single target-deposited and multilayer deposited films, respectively. The microscopic analysis shows in both cases polycrystalline films with comparable average crystallite size of 18±10 nm for the $Li_4Ti_5O_{12}$-containing single target-deposited film and 21±10 nm for the $Li_7Ti_5O_{12}$-containing multilayer deposited film. In the single target-deposited film with the lower lithiation, an interplanar spacing in (111) oriented grains of 0.482 nm was found (as shown in FIG. 5G). In contrast, for the multilayer deposited film, a the interplanar distance in (111) oriented grains is slightly enlarged to 0.488 nm (as shown in FIG. 5H). The reduced fast Fourier Transform results suggest a rock-salt-like crystal structure in the $Li_7Ti_5O_{12}$ phase, combined with slight elongation along the (111) direction (inset of FIG. 5H). This elongation is a strong indication of a successful deposition at a larger lithium concentration per unit cell and points to the $Li_7Ti_5O_{12}$ phase for the multilayer deposited film.

Figure 5I:
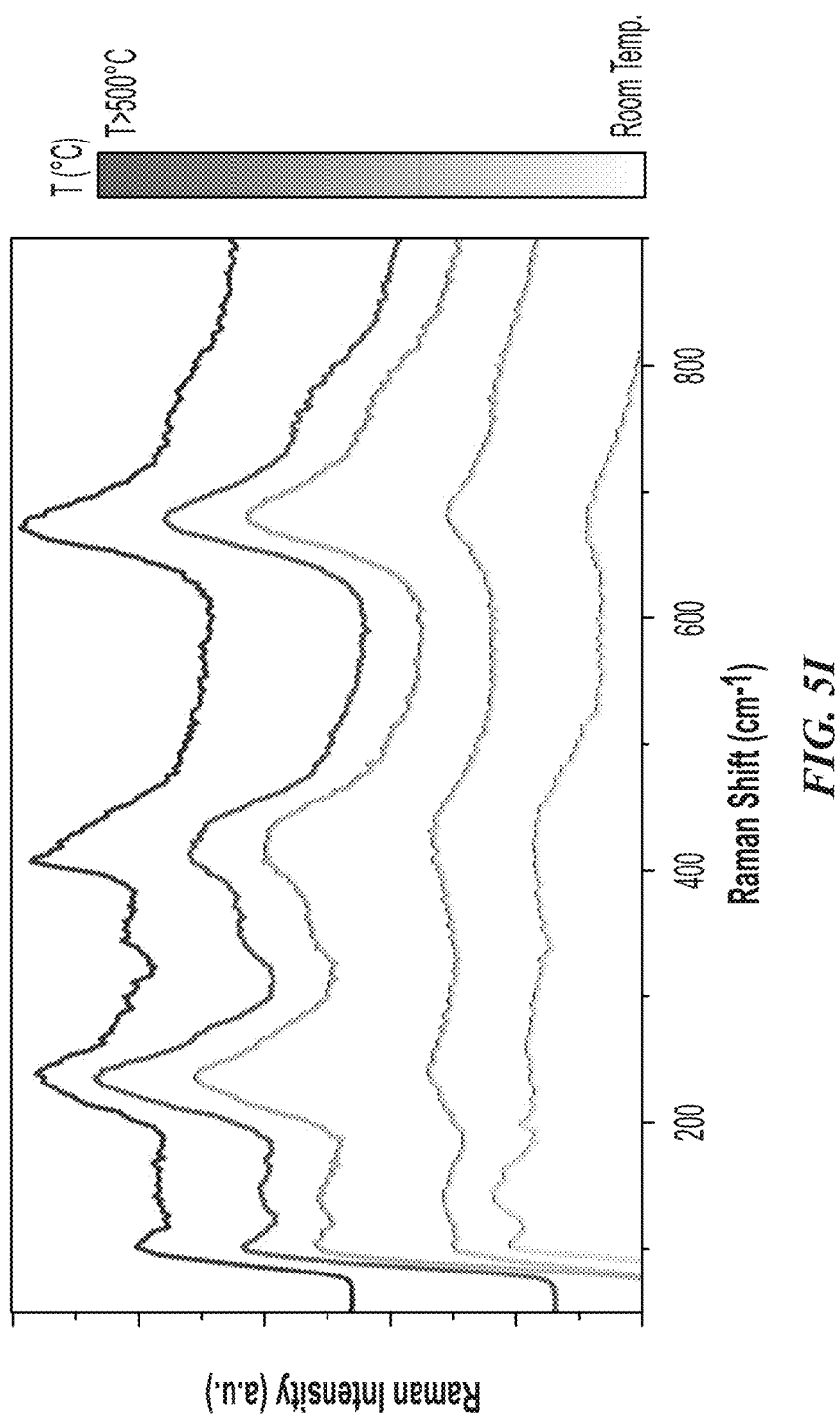
FIG. 5I shows Raman vibrational spectra of a progression of ex-situ annealed multilayer lithium titanate films during an annealing process, according to some embodiments.

Raman vibrational spectroscopy was used in order to further investigate potential distinguishing characteristics or phases between the films formed by the single target deposition approach and the multilayer approach. FIG. 5F shows the Raman spectrum of both thin films together with the powder reference data for pure $Li_4Ti_5O_{12}$ and for the overlithiated $Li_{7.1}Ti_5O_{12}$ PLD target. Three main Raman active bands were observed for pure $Li_4Ti_5O_{12}$ positioned at 671, 421, and 231 cm$^{-1}$, which are attributed to the symmetric stretching vibration mode $A_{1g}$ of the Ti—O bond, the asymmetric stretching mode $E_g$ of the Li—O bond, and the bending vibration mode $F_{2g}$ of the Ti—O, respectively. The good match between the $Li_4Ti_5O_{12}$ reference powder and the single target deposited film (from the overlithiated $Li_{7.1}Ti_5O_{12}$ pellet) confirmed the formation of the spinel $Li_4Ti_5O_{12}$ phase on top the Pt/$Si_3N_4$/Si substrates. In the Raman spectrum of the multilayer film, peaks corresponding to extra vibrations at 300 cm$^{-1}$ were observed, along with a split peak at around 421 cm$^{-1}$, which, without being bound by any particular theory, are linked to Li vibrations arising from the strong overlithiation of the pellet as additional Li ions are transferred to the multilayer deposited film, which confirmed the presence of extra lithium when compared to the single target deposited film. The excellent match between the spectrum of the multilayer film and the spectrum of the overlithiated pellet suggested that the initially deposited $Li_3N$ was fully decomposed, and that the Li diffused into the initially deposited $Li_4Ti_5O_{12}$ layers during the fabrication process. This was further supported by the Raman spectra shown in FIG. 5I, which shows the progression of ex-situ annealed multilayer films during an annealing process. In FIG. 5I, the Raman spectrum of the initially deposited $Li_4Ti_5O_{12}$ was observed, which was then transformed into the close-to-$Li_7Ti_5O_{12}$ phase upon annealing.

Figure 5J:
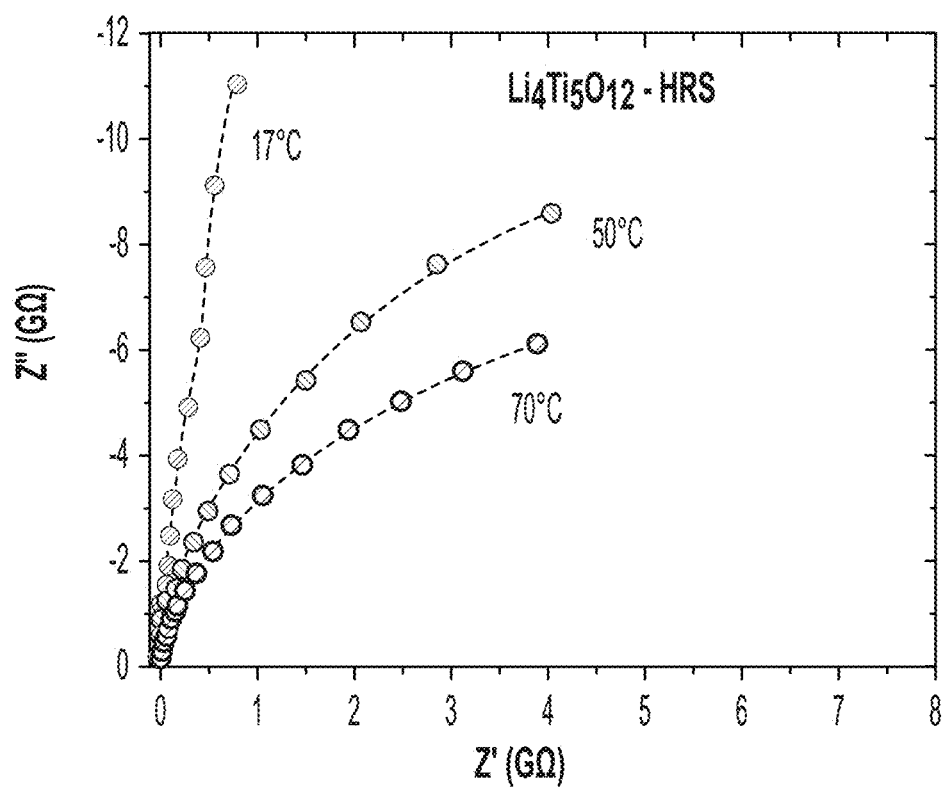
FIG. 5J shows electrochemical impedance spectroscopy results for a single target-deposited film, according to some embodiments.
Figure 5K:
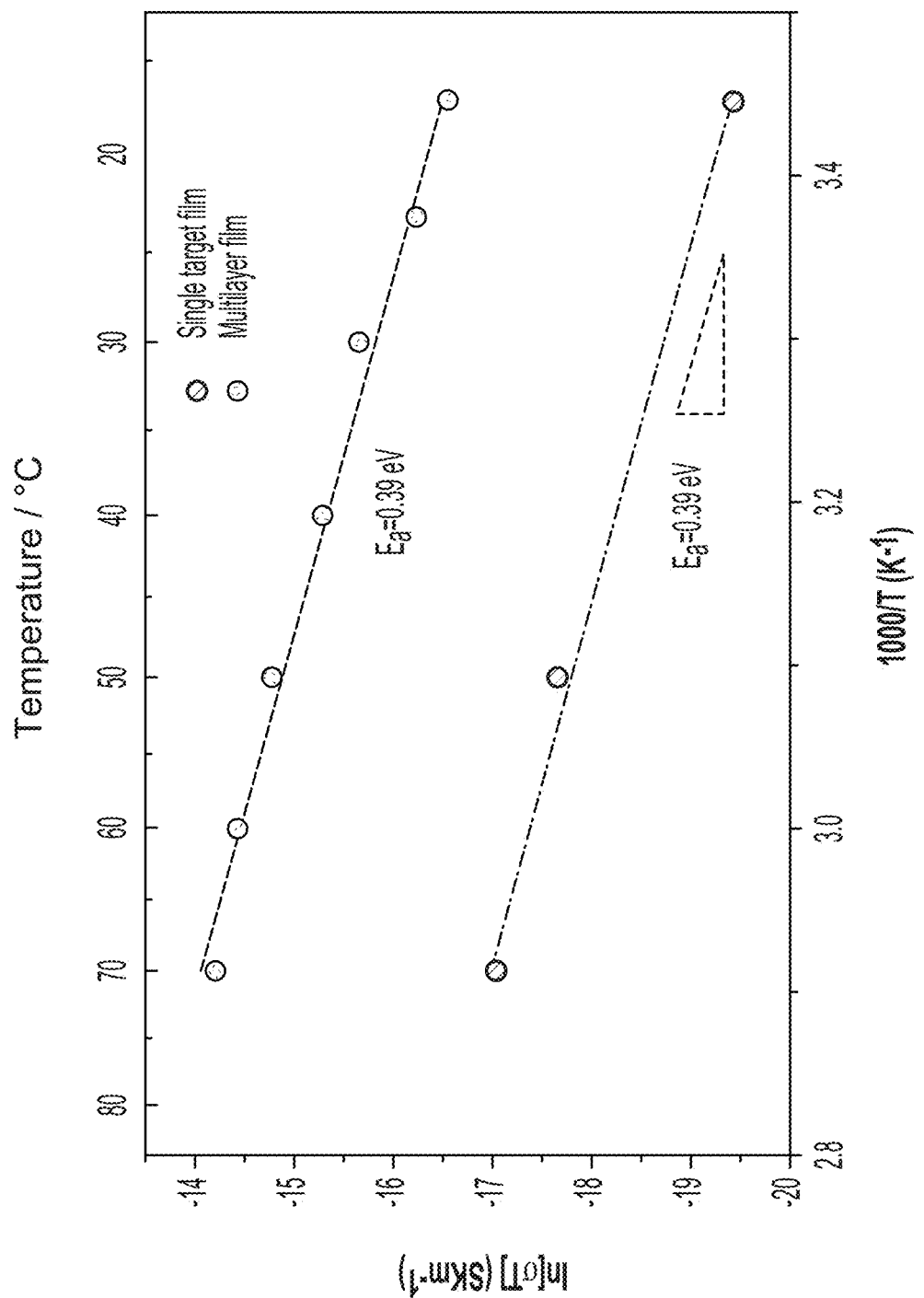
FIG. 5K shows cross-plane geometry conductivities and activation energies for single target-deposited and multilayer deposited films, according to some embodiments.

The Li-ion transport kinetics of the memristive devices described above were probed using electrochemical impedance spectroscopy. FIG. 5J depicts the electrochemical impedance spectroscopy results for the single target deposited film (comprising $Li_4Ti_5O_{12}$). Due to the near-room temperature conditions, incomplete semicircles were acquired. A cross-plane measuring configuration was employed using a top square Pt electrode on top of the $Li_4Ti_5O_{12}$ film, with each side of the Pt electrode having a length of 250 µm. Because an accurate measurement of the impedance at room temperature was not possible due to the low ionic conductivity of the lithium titanate material (see FIG. 5J), an equivalent circuit model of a resistor in parallel with a constant-phase element was used to analyze the Arrhenius behavior of the conductivity for films grown using each strategy (single deposition vs. multilayer), which was in turn used to estimate the bulk resistance value. Using the cross-plane geometry, the $Li_4Ti_5O_{12}$ single target deposited film and $Li_7Ti_5O_{12}$ multi target deposited film were measured to have an activation energy of 0.39 eV and a room temperature conductivity of S=1×10$^{-13}$ S/cm (see FIG. 5K) for the $Li_4Ti_5O_{12}$ case. An increase of the conductivity was observed for the multilayer film case. The low activation energy found in this example also agrees with experimental literature values via low temperature fittings and first principle calculations of Li-migration

EXAMPLE 2

Resistive Switching Properties

Figure 6A:
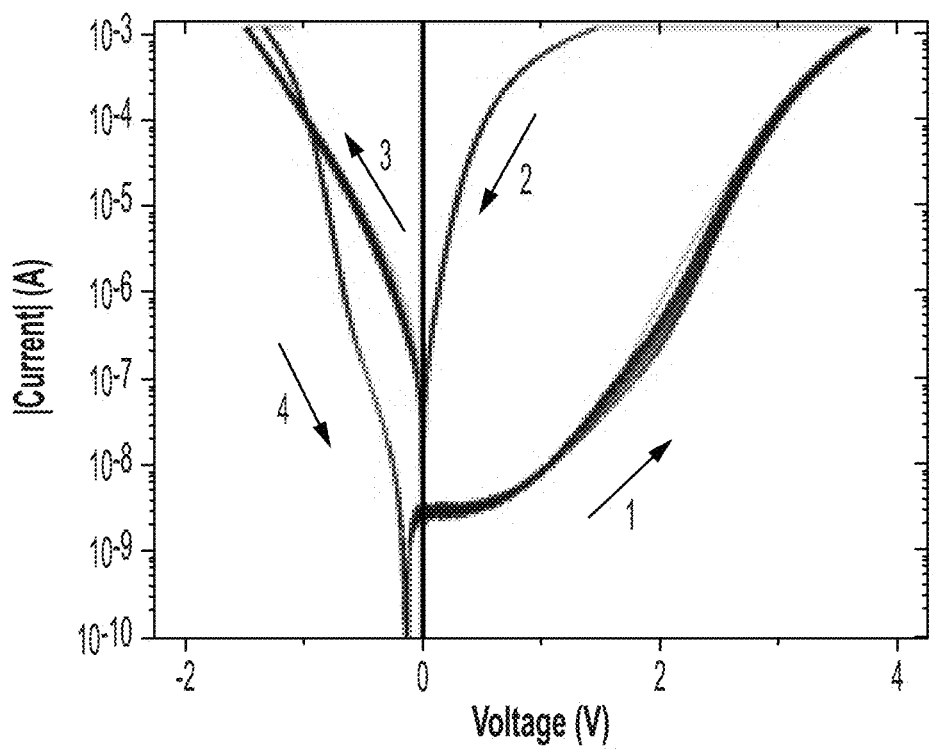
FIG. 6A shows cyclic voltammetry results for a memristive device unit comprising a single target-deposited film, according to some embodiments.
Figure 6B:
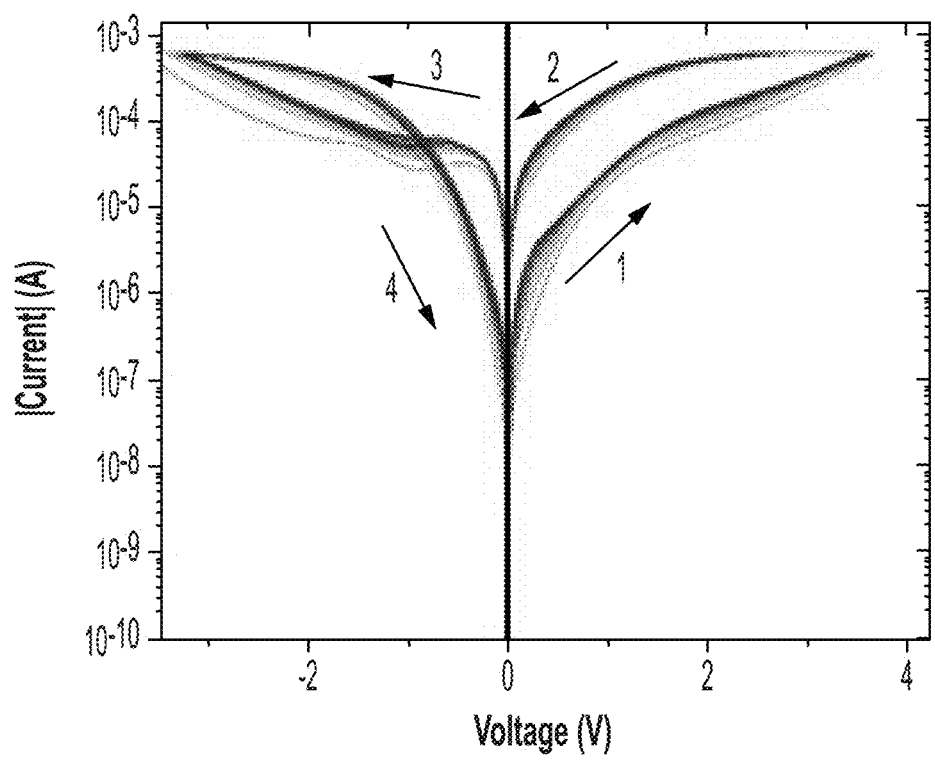
FIG. 6B shows cyclic voltammetry results for a memristive device unit comprising a multilayer deposited film, according to some embodiments.
Figure 6C:
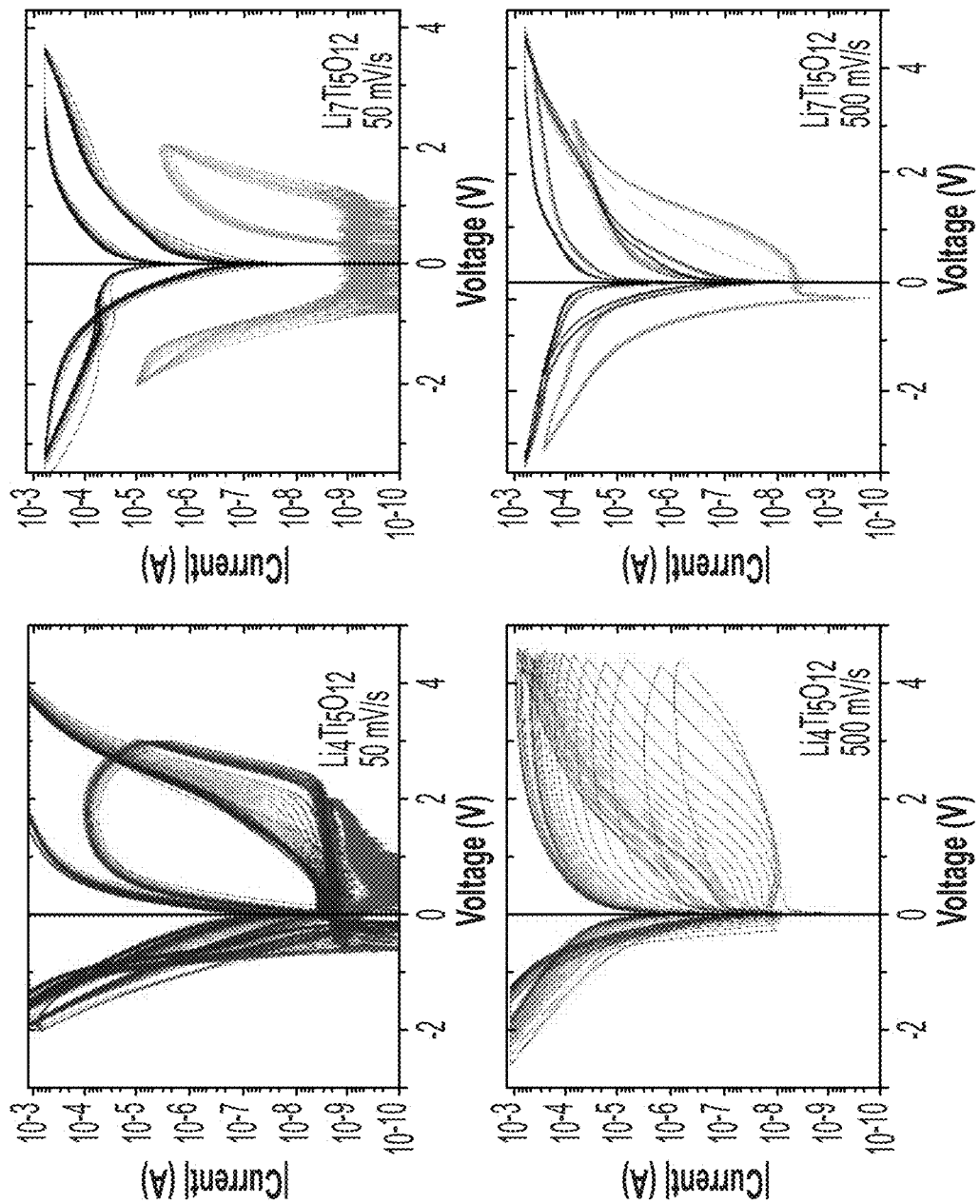
FIG. 6C shows cyclic voltammetry results for memristive devices comprising either single target-deposited or multilayer deposited films at different scan rates, according to some embodiments.

This example describes an analysis of certain resistive switching properties of the memristive devices fabricated in Example 1. To illustrate the switching behavior of Pt/Li-titanates/Pt films, classic cyclic voltammetry was performed applying a positive voltage to the top electrode of the a memristive device unit containing $Li_4Ti_5O_{12}$ (single target film device, FIG. 6A) and $Li_7Ti_5O_{12}$ (multilayer film device, FIG. 6B) at a sweep rate of 50 mV/s for 50 cycles. In both cases, the devices initiated in a High Resistance State (HRS) or "OFF-state" and, upon the application of a positive bias they turned into a Low Resistance State (LRS) or "ON-state". Reversing the voltage, i.e., by applying a negative bias, in both cases caused a transition from the HRS to the LRS. Two remarkable differences between the delithiated (single target film device) and the overlithiated (multilayer film device) phases were observed, namely the resistance ratio (ratio of resistance in HRS/"OFF-state" to resistance in LRS/"ON-state") and the symmetry of the current-voltage (I-V) profile. The memristive device containing $Li_4Ti_5O_{12}$ exhibited a resistance ratio of up to $10^6$, while the memristive device containing $Li_7Ti_5O_{12}$ exhibited a resistance ratio of up to $10^2$. While a larger resistance ratio was obtained in the $Li_4Ti_5O_{12}$ case, more symmetric I-V curves were observed in the $Li_7Ti_5O_{12}$ case. No electroforming step was applied in any case. A second difference arose when analyzing the kinetic response of both films. By increasing the sweep rate to 500 mV/s (i.e., by one order of magnitude) (see FIG. 6C), the $Li_4Ti_5O_{12}$ device was not able to respond as fast as the $Li_7Ti_5O_{12}$ device, which showed stable and reproducible cycling at one order of magnitude higher sweep rate.

Figure 6D:
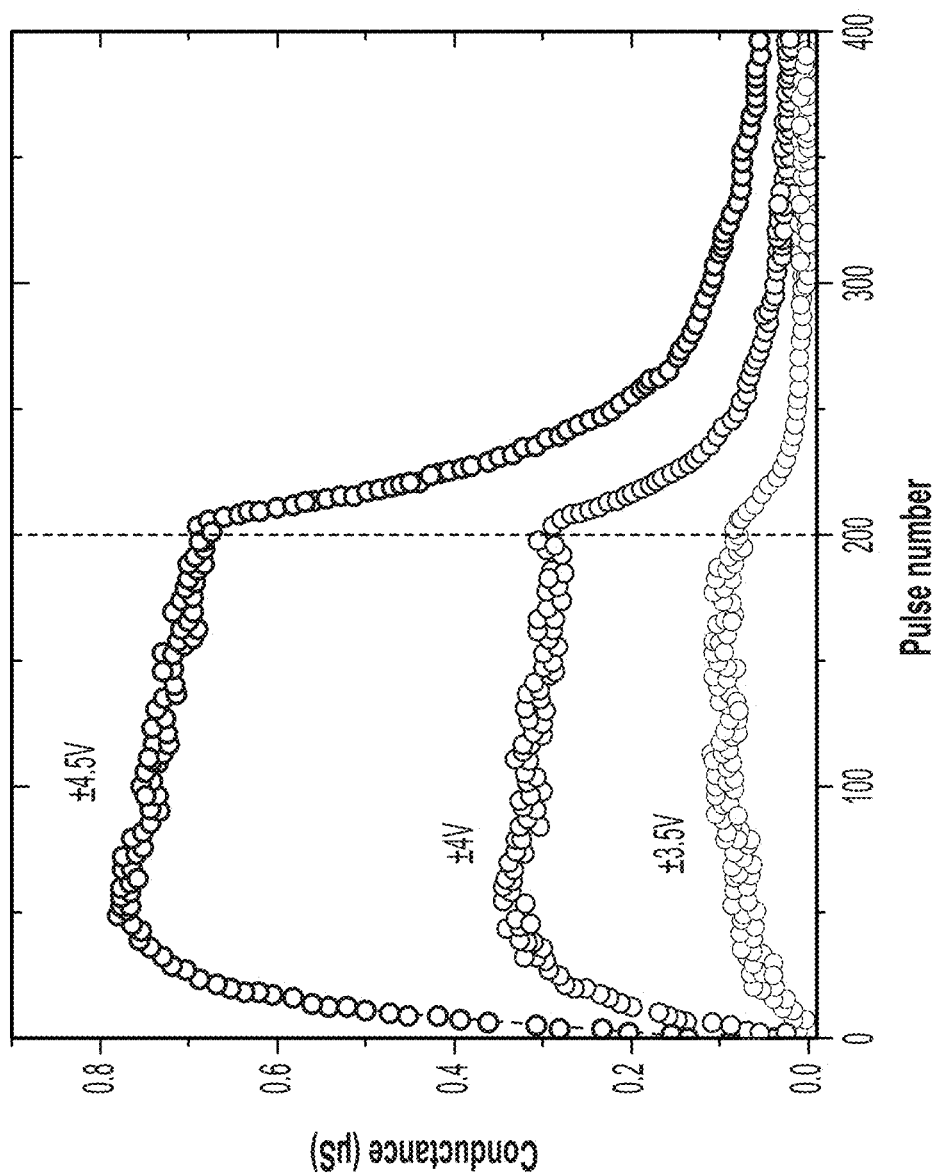
FIG. 6D shows train voltage pulse data for a memristive device unit comprising a single target-deposited film, according to some embodiments.
Figure 6E:
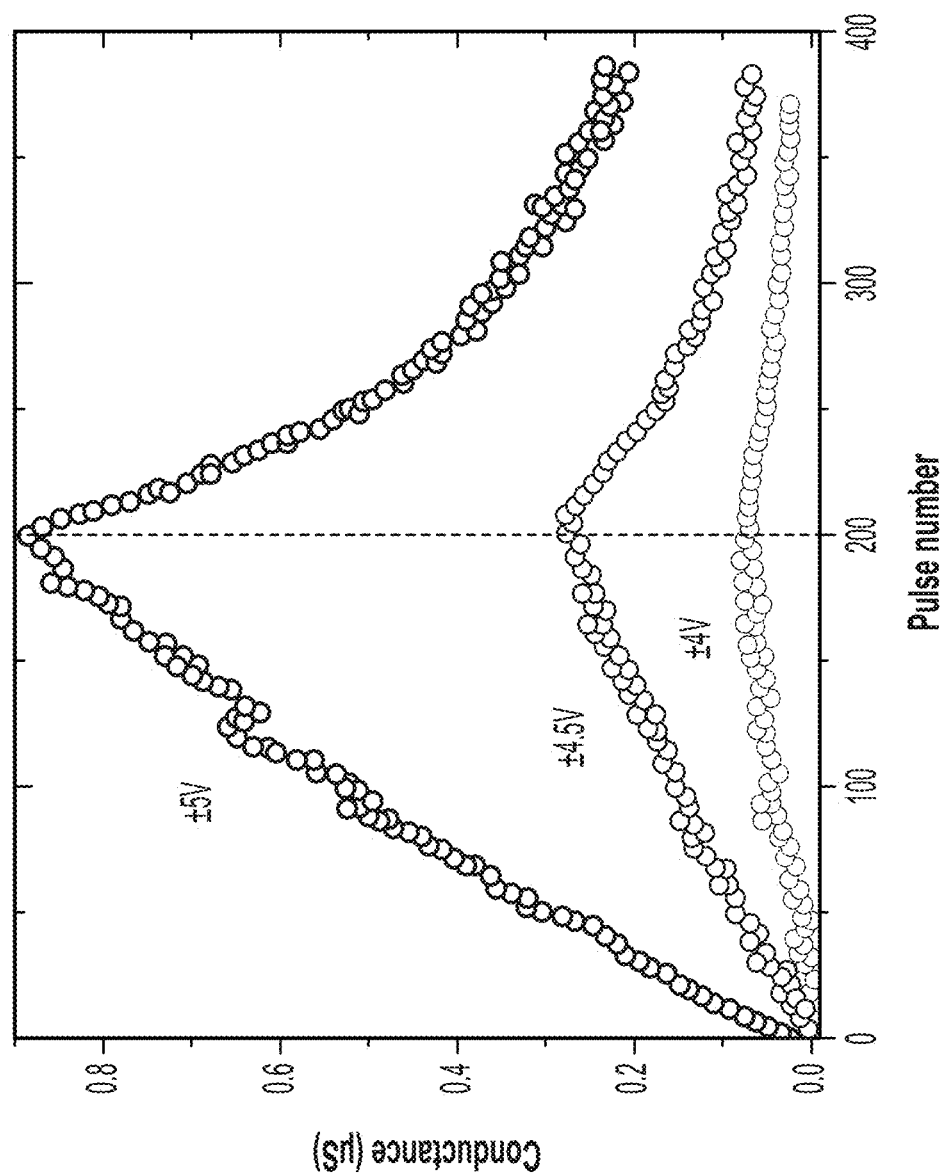
FIG. 6E shows train voltage pulse data for a memristive device unit comprising a multilayer deposited film, according to some embodiments.

To further exemplify the different switching behavior of both systems, pulsing schemes were used. Train voltage pulses (200 for each polarity) of 500 ms width and different amplitudes (as indicated in the FIGS. 6D-6E) were applied in pristine Pt/Li-titanate/Pt memristive units for the $Li_4Ti_5O_{12}$ (FIG. 6D) and $Li_7Ti_5O_{12}$ (FIG. 6E) cases. In the former (FIG. 6D), for every voltage amplitude tested (±3.5V, ±4V and ±4.5V), the conductance of the device saturated after few tens of pulses to a given conductance value, which is voltage dependent. The time to saturate the conductance of the device, a.k.a., the slope in the conductance-pulse profiles was more pronounced at larger biases as well. The same trend in FIG. 6D was observed when the negative train pulses were applied, with the conductance of the device decreasing rapidly to the initial HRS after 100 pulses. A qualitatively different behavior was observed when similar voltage pulse trains were applied to the $Li_7Ti_5O_{12}$ devices (FIG. 6E). First, saturation was observed upon the application of 200 positive pulses, even though higher voltages were used. Second, the negative pulse trains were much more symmetric than in the $Li_4Ti_5O_{12}$ case (shown in FIG. 6D), and a close-to-ideal symmetry could be obtained by adapting the pulsing scheme. Thus, it was concluded that a more symmetric I-V profile results in a more symmetric pulse response, which suggested that the different resistive switching characteristics and system response could be achieved by varying the Li content in the film during growth.

Figure 7A:
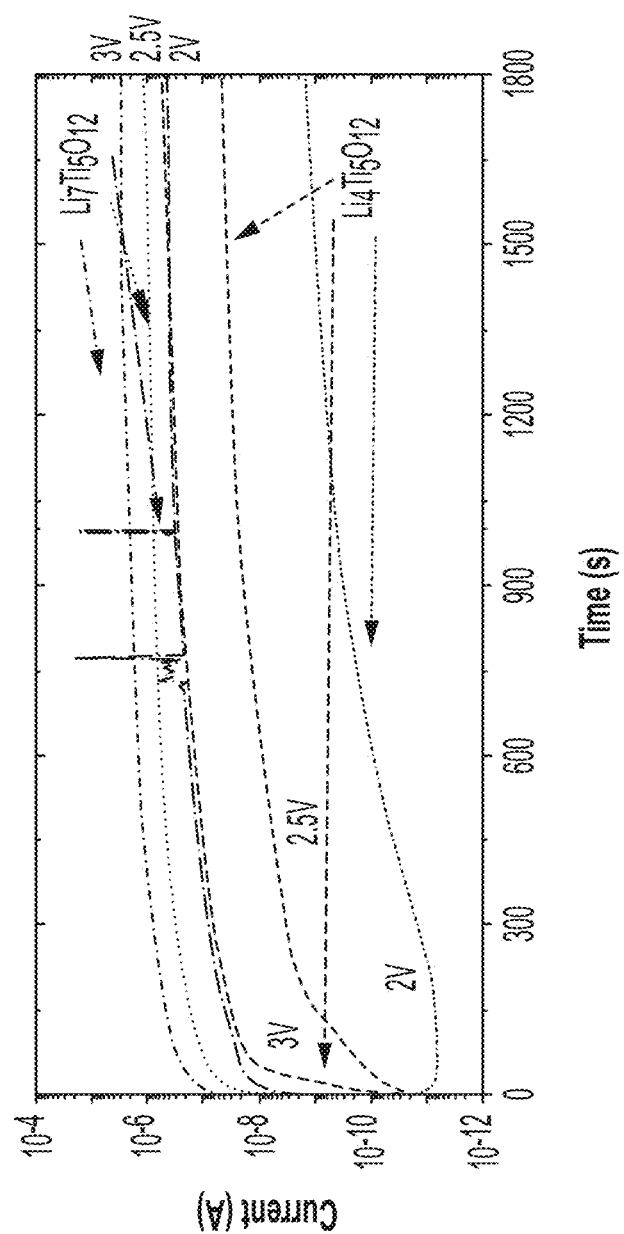
FIG. 7A shows low bias chronoamperometry measurements for memristive device units comprising either $Li_4Ti_5O_{12}$ or $Li_7Ti_5O_{12}$, according to some embodiments.

Once the different switching response for the delithiated $Li_4Ti_5O_{12}$ and the overlithiated $Li_7Ti_5O_{12}$ was tested at medium-bias range by cyclic voltammetry and pulsing schemes, low bias chronoamperometry measurements were performed. FIG. 7A depicts data from the low bias chronoamperometry measurements. The primary goal of such measurements was to extract information about the resistive switching mechanism and Li-ion drift and diffusion, which are normally not accessible by classic cyclic voltammetry and pulsing measurements. FIG. 7A displays the current versus time profiles for $Li_4Ti_5O_{12}$ and $Li_7Ti_5O_{12}$ at different fix bias (+2V, +2.5V and +3V). The different responses for each film at these low biases for these films were readily apparent upon inspection of the data in FIG. 7A. The response of the $Li_7Ti_5O_{12}$ memristive device units was fast, needing only some seconds to transition from a regime where the switching event was taking place to a second regime where a stable limiting current was reached at large times. In contrast, the $Li_4Ti_5O_{12}$ response to the same biases was much slower, and it required a larger bias, i.e., 3V, to reach a similar response to the 2V current-time profile of the $Li_7Ti_5O_{12}$ bits.

Figure 7B:
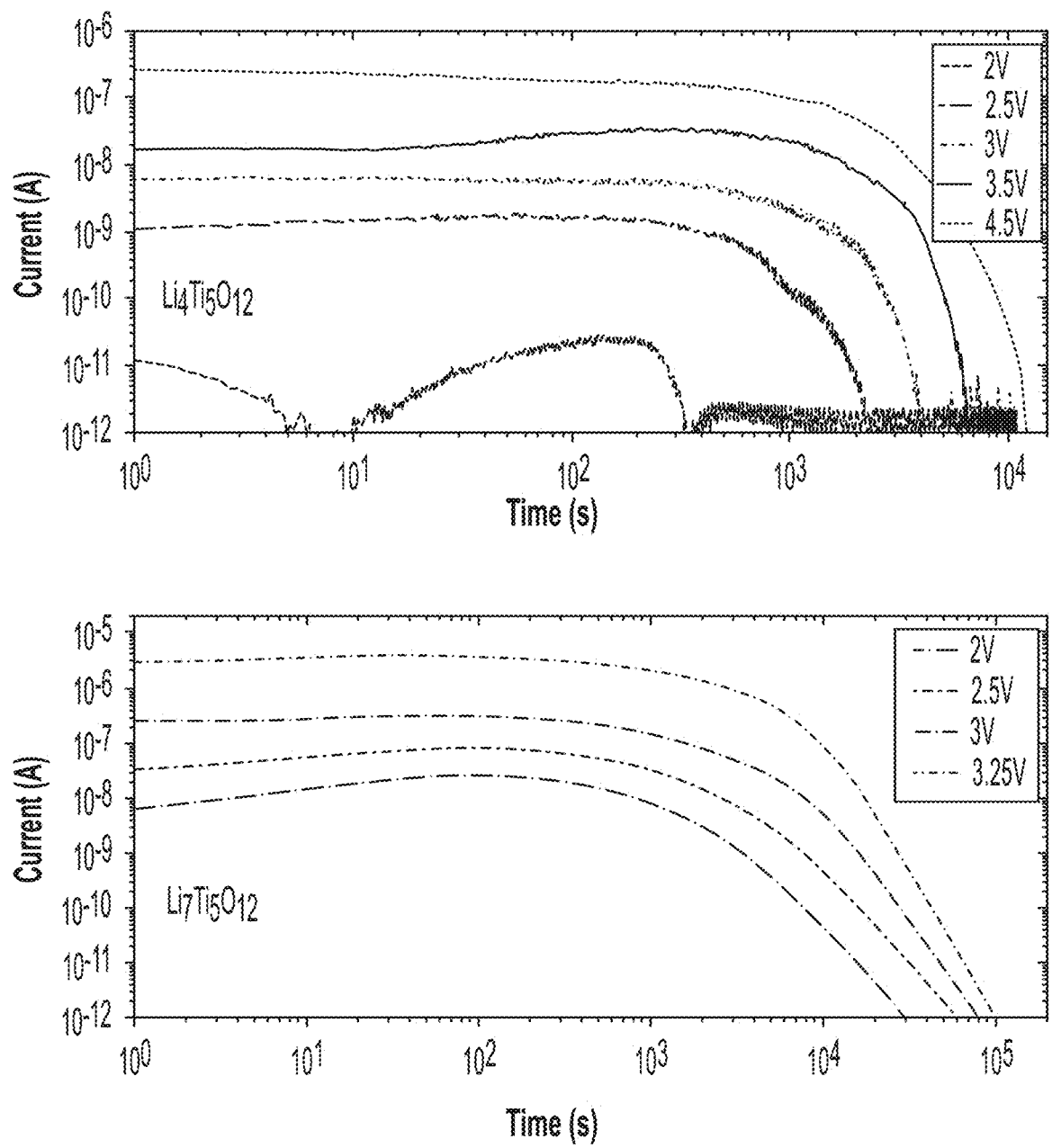
FIG. 7B shows relaxation time versus time measurements for memristive device units comprising either $Li_4Ti_5O_{12}$ or $Li_7Ti_5O_{12}$, according to some embodiments.
Figure 7C:
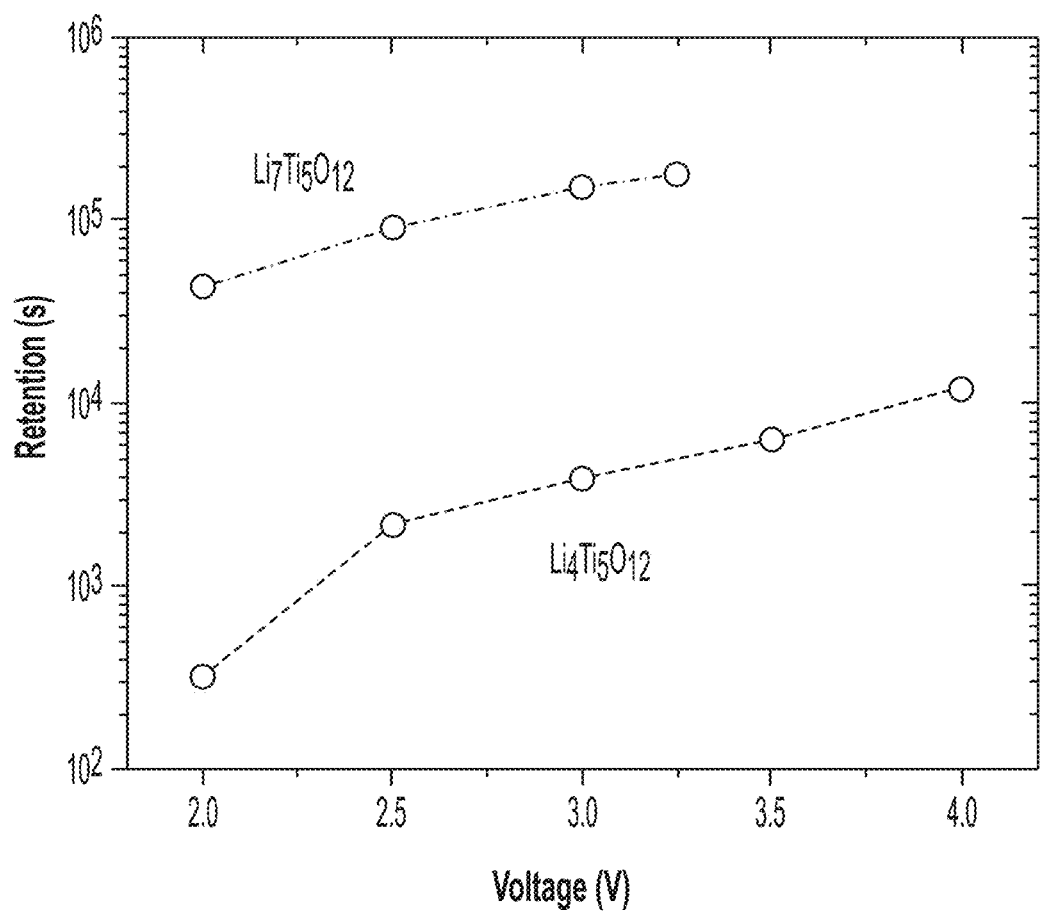
FIG. 7C shows retention time measurements as a function of voltage for memristive device units comprising either $Li_4Ti_5O_{12}$ or $Li_7Ti_5O_{12}$, according to some embodiments.
Figure 7D:
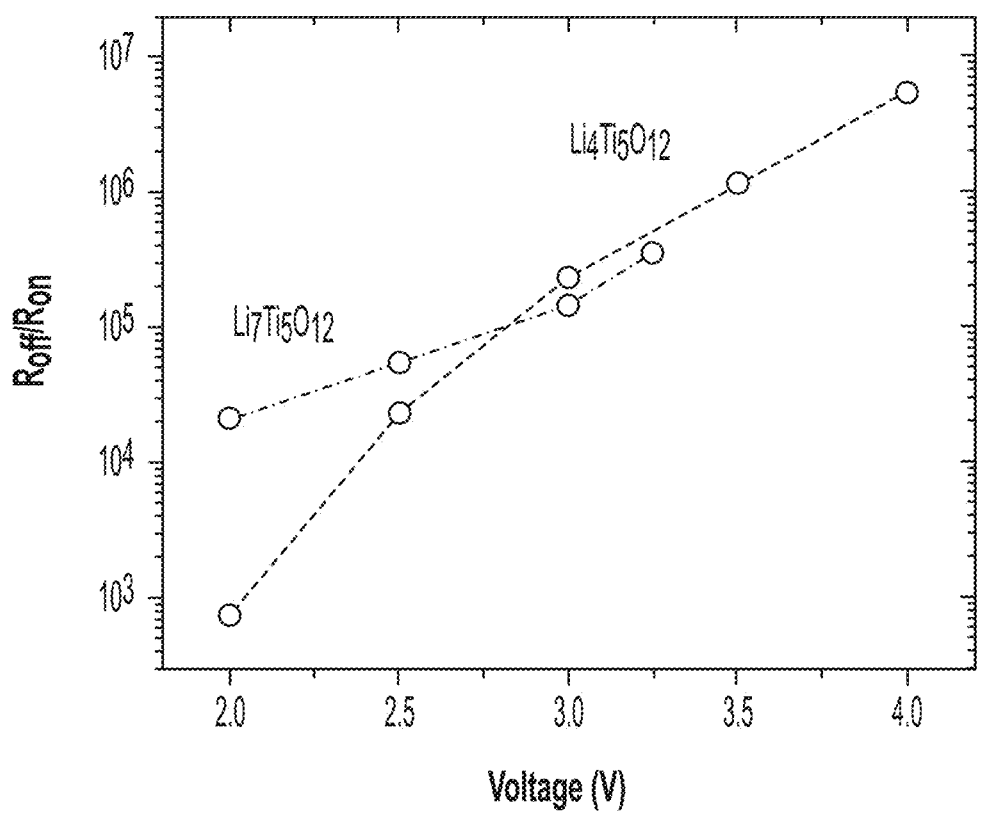
FIG. 7D shows resistance window data for memristive device units comprising either $Li_4Ti_5O_{12}$ or $Li_7Ti_5O_{12}$, according to some embodiments.

To access some parameters, such as the retention of the different resistive states and the accessible resistance window of the devices, the relaxation time versus time was tracked at low bias (250 mV) until the initial HRS was achieved (see FIG. 7B). The retention of the system is defined as the time at which the current reaches the original HRS value (FIG. 7C). For both Li contents, the retention depended on the bias used to generate the LRS, which was more pronounced in the case of the $Li_4Ti_5O_{12}$. Remarkably, the retention was enhanced by almost a factor of 100, reaching the milestone of $10^5$ s in the overlithiated $Li_7Ti_5O_{12}$ case. Similar to this, the resistance values at low bias after at t=0 on the relaxation profiles were extracted to analyze the accessible resistance window, or in other words, the sensitivity of the devices to change resistance as a function of the applied bias (FIG. 7D). The resistance window for the $Li_4Ti_5O_{12}$ spanned over 4 orders of magnitude in the voltage range 2V-4V, while this same range produced a resistance window of 2 orders of magnitude for $Li_7Ti_5O_{12}$.

In addition, a method using the memristor-based Cottrell equation was used to analyze the chronoamperometry measurements in order to derive diffusion time constants. The analysis started with the Cottrell equation:

$$i_j = \frac{nFAc\sqrt{D_j}}{\sqrt{\pi t}} \tag{1}$$

where $i_j$ represents the diffusion current, n is the number of electrons transferred, F is Faraday constant, A is the geometric electrode area, c the bulk concentration of the diffusive species (in this case, lithium ions), t is the time, and $D_j$ chemical diffusion coefficient. The methodology required that a steady state be achieved over time upon the application of a given bias, which was the case for all the biases tested for both the $Li_4Ti_5O_{12}$ film and the $Li_7Ti_5O_{12}$ film. The steady state current is usually named limiting current, and can be defined as $$I_{diff} = I_{lim} - I(t) \tag{2}$$

Figure 7E:
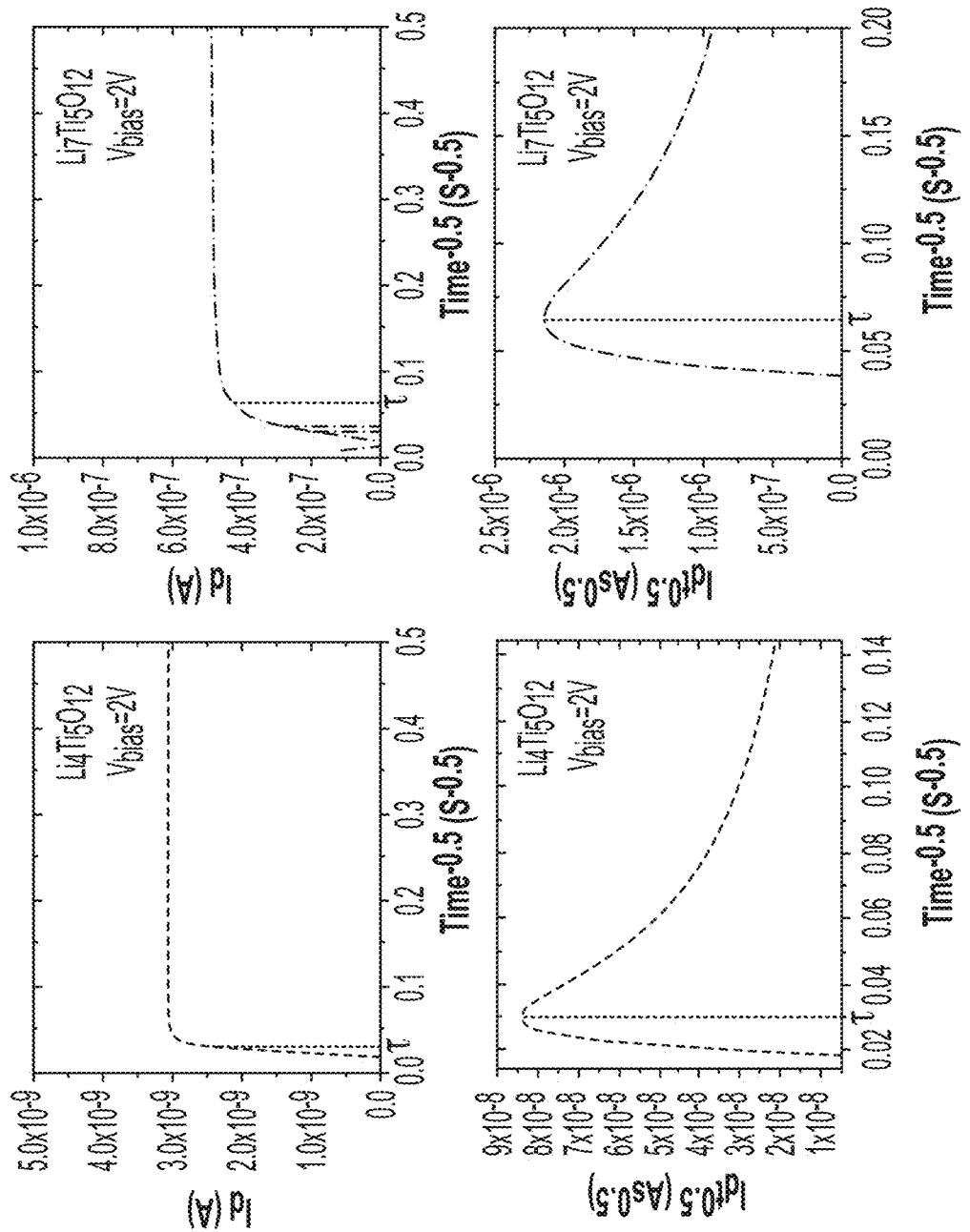
FIG. 7E shows time constants and data derived from chronoamperometry experiments for memristive device units comprising either $Li_4Ti_5O_{12}$ or $Li_7Ti_5O_{12}$, according to some embodiments.
Figure 7F:
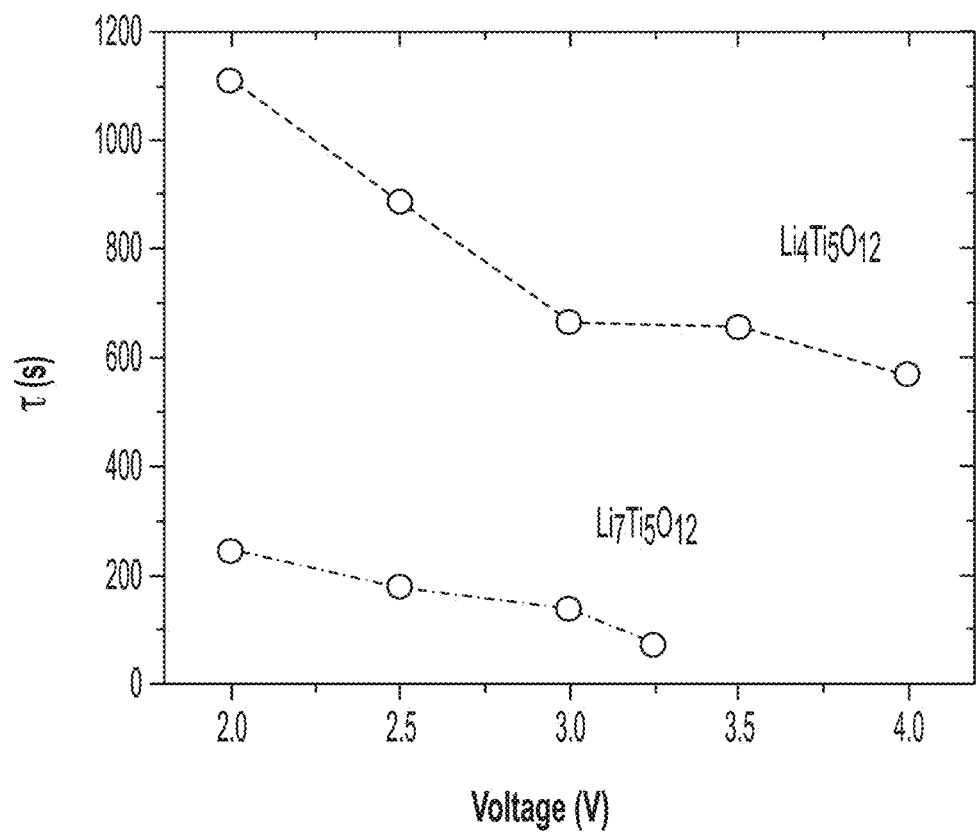
FIG. 7F shows time constants as a function of voltage for memristive device units comprising either $Li_4Ti_5O_{12}$ or $Li_7Ti_5O_{12}$, according to some embodiments.

Equation (1) can be rearranged and combined with the differential transient current data from the chronoamperometry measurements to arrive at Eq. 3:

$$D = \left[ \frac{(I_{diff}\sqrt{t})\sqrt{\pi}}{nFAc} \right]^2 \tag{3}$$

where the time, τ, is a material-dependent time constant defined as the time at which $I\sqrt{t}$ has a maximum with respect to the bias applied. In other words, τ is the time that the system requires to redistribute the charge carriers (lithium cations, in this case) to a new equilibrium LRS. To exemplify the methodology, data from FIG. 7E was analyzed using the above procedure to obtain the time constant τ for each bias and for each Li-content. The results of the whole analysis (FIG. 7F) evinced a bias-dependent diffusion of the mobile species in the films, which was more pronounced in the case of the delithiated $Li_4Ti_5O_{12}$ case. Comparing the absolute values of the time constants for both cases, Li cations diffused a factor of ~5-6 faster in the overlithiated $Li_7Ti_5O_{12}$ than in the $Li_4Ti_5O_{12}$.

The abovementioned methodology also allowed for an estimate of diffusion coefficients, provided precise values of the bulk concentration of the diffusive species.

EXAMPLE 3

Resistive Switching Mechanism

The results of Examples 1 and 2 demonstrate a significant change in the resistive switching (e.g., memristive) properties linked to the Li-ion migration for both lithiation degrees in Pt/Li-titanates/Pt memristive units, which were initially defined by the processing conditions (single target strategy vs. multilayer strategy). Given the knowledge generated by the battery community, but without being bound by any particular theory, it is feasible that the distinctive transport properties found in the memristive systems of Examples 1 and 2 arose from a different arrangement of Li-ions within the film. While the delithiated $Li_4Ti_5O_{12}$ film crystallized in a spinel structure, where Li-ions are distributed in 8a positions, the overlithiated $Li_7Ti_5O_{12}$ possessed a rock-salt structure, with the Li-ions populating mainly 16c positions. This difference in the Li-ions positions within the structure could explain the switching characteristics of both of the cases reported in Examples 1 and 2. In general, a large increase in electronic conductivity occurs upon Li intercalation, which is consistent with the resistive switching properties observed the memristive device units of Examples 1 and 2.

Figure 7G:
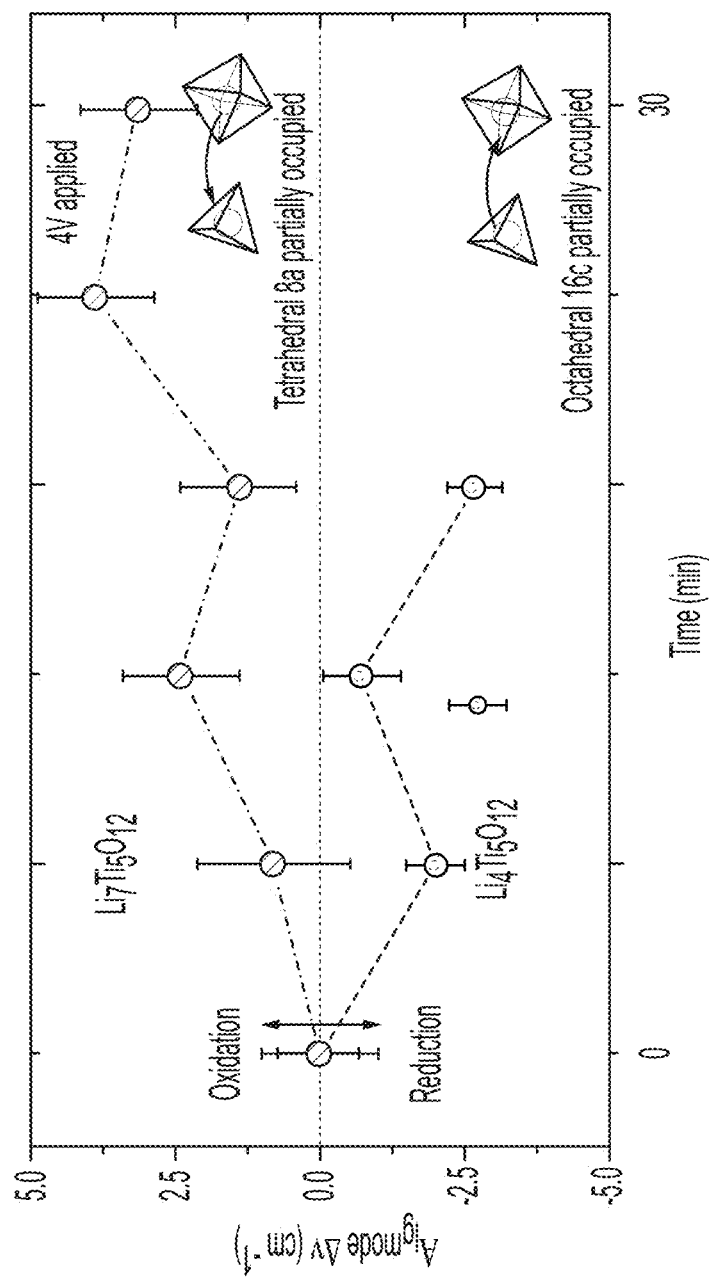
FIG. 7G shows a plot of in-operando Raman vibrational spectroscopy of a lithium titanate memristive device unit tracking the normalized frequency shift in the $A_{1g}$ titanium-oxygen (Ti—O) Raman mode upon applied electrical potential over time, according to some embodiments.

FIG. 7G shows a plot of in-operando Raman vibrational spectroscopy of a lithium titanate memristive device unit tracking the normalized frequency shift in the $A_{1g}$ titanium-oxygen (Ti—O) Raman mode upon applied electrical potential over time. The methodology of FIG. 7H allowed for the probing of the lithium occupancy of the tetrahedral 8a and 16c octahedral structural sites, which indicate local changes of electronic states, and thus indicate metal-insulator transitions. By applying an electrical potential of +4 V to a $Li_4Ti_5O_{12}$ memristive device unit over time, the $A_{1g}$ mode decreased continuously in time from 676 to 673±0.5 cm$^{-1}$, implying a partial reduction of the original $Ti^{4+}$ to $Ti^{3+}$. However, when the electrical potential of +4 V was applied to a $Li_7Ti_5O_{12}$ memristive device unit over time, the opposite trend was observed, where the $A_{1g}$ band changed from 665 to 669 cm$^{-1}$, implying the partial oxidation of the reduced $Ti^{3+}$ to $Ti^{4+}$.

Figure 7H:
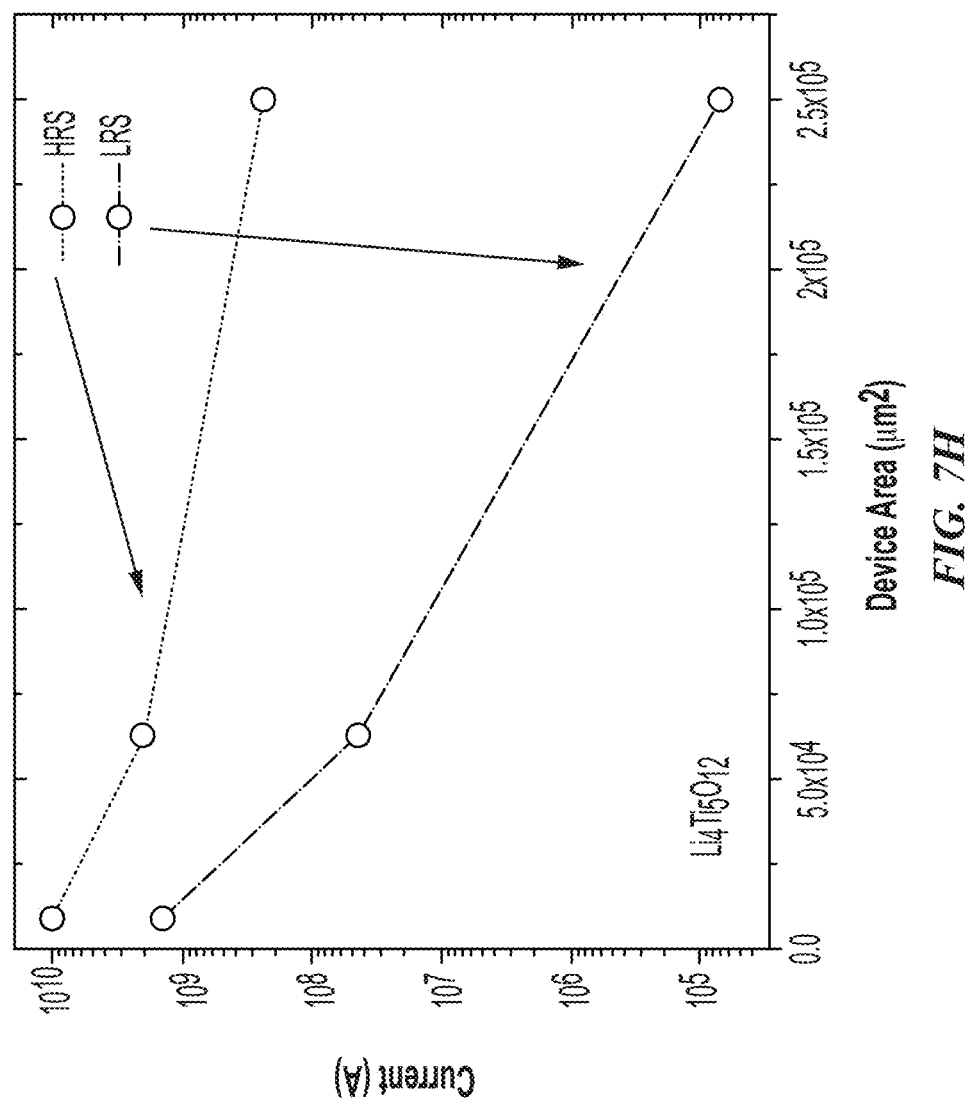
FIG. 7H shows area-dependent currents for a $Li_4Ti_5O_{12}$ resistive switching device in a high resistance state and in a low resistance state, according to some embodiments.

Without being bound by any particular theory, the observed resistive switching properties in Examples 1 and 2 may be explained via analogy between an electrochemical cell where Li is externally intercalated and the devices of Examples 1 and 2. In an electrochemical cell employing a delithiated $Li_4Ti_5O_{12}$ system, Li-ions may start to be inserted electrochemically. As lithium is being intercalated, $Li^+$ ions in the 8a positions start to migrate from 8a positions to 16c positions, increasing the electronic conductivity of the system by creating a percolative network of highly conducting paths. In that scenario, Li de-intercalation produces the reverse effect, i.e., $Li^+$ ions will migrate from 16c positions to 8a positions with a consequent decrease in electronic conductivity. In the case of the resistive switching devices described herein, the high electric field applied in the nanometric size films might play a similar role to the external Li insertion, causing the migration from 8a to 16c positions and generating a similar percolative homogenously distributed network that increases the electronic conductivity, as found experimentally (see FIGS. 6A, 6B, 6D, 6E and FIGS. 7A, 7C-D, and 7F). FIG. 7H depicts the area-dependency of a $Li_4Ti_5O_{12}$ memristive device unit in both its high resistance state and its low resistance state. Analysis of the area-dependence, which shows increasing resistance as the device area is increased, can be used for further mechanistic insight. Specifically, the area-dependence shown in FIG. 7H supports a conclusion that the resistive switching behavior at least in this instance is not due to classical metal filament formation (as in the case of $Ag^{2+}$ and $Cu^{2+}$ resistive switching devices). Instead, the area-dependence in FIG. 7H supports a phase-separation mechanism between $Li_4Ti_5O_{12}$ and $Li_7Ti_5O_{12}$ in the shape of filaments, at least in this example.

EXAMPLE 4

Perspectives and Challenges for Li-Ion Memristors

A significant main challenge ahead for resistive switching (e.g., memristive) devices relying on Li-ion migration is to achieve the maturity level achieved in their $O^{2-}$ and $Ag^+$/$Cu^{2+}$ counterparts.

Figure 8B:
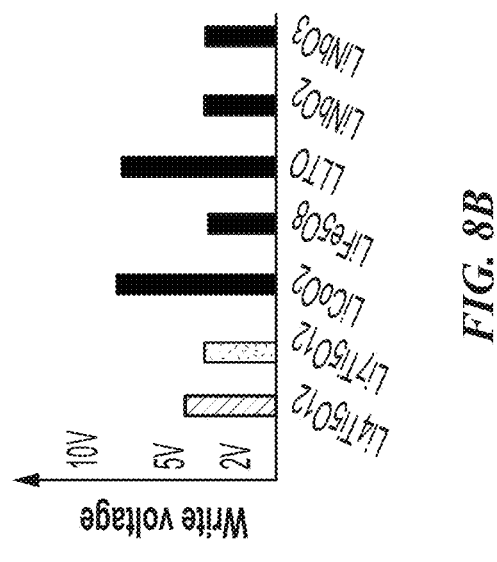
FIG. 8B shows write voltage properties of Li-titanate resistive switching devices compared to other Li-based memristive systems, according to some embodiments.
Figure 8A:
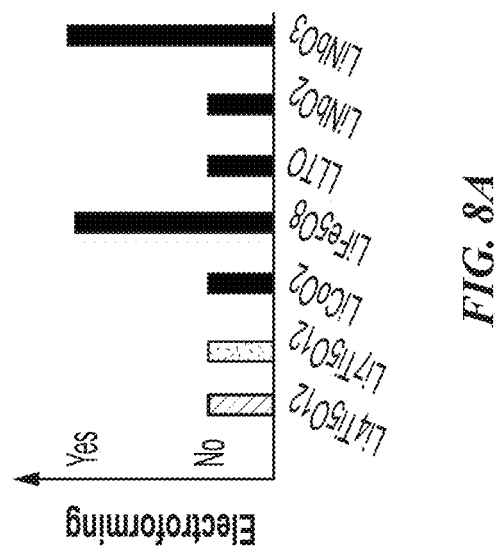
FIG. 8A shows electroforming properties of Li-titanate resistive switching devices compared to other Li-based memristive systems, according to some embodiments.

This example provides a rough summary of the main properties reported so far for Li-based resistive switching devices. FIGS. 8A-8H give a quick and fast overview of the Li-based materials and their performance metrics that have been reported so far:

Electroforming (FIG. 8A): A lack of electroforming is one of the main advantages of some Li-based memristive systems when compared to traditional memristors. Electroforming is one of the major sources of device-to-device variations, which has slowed the widespread commercial use of memristors. This fact serves as a strong point for Li-based memristors. FIG. 8A shows that the Li-titanate based resistive switching devices of Examples 1 and 2 do not show electroforming.

Write voltage (FIG. 8B): Low voltage operation is important for achieving low-power consumption devices, especially towards neuromorphic computing applications, which would require large parallelization of the operations. FIG. 8B shows that the Li-titanate based resistive switching devices of Examples 1 and 2 show a relatively small resistance windows.

Figure 8D:
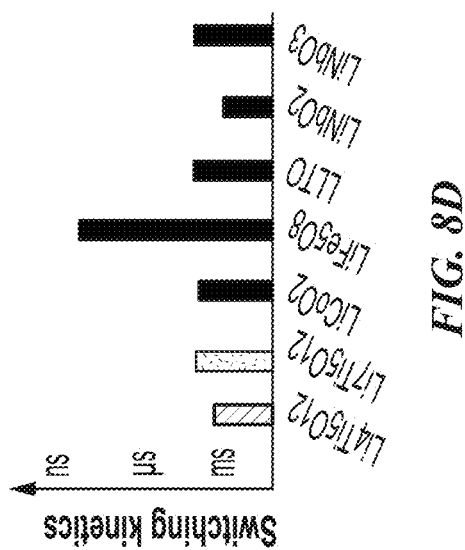
FIG. 8D shows switching kinetics properties of Li-titanate resistive switching devices compared to other Li-based memristive systems, according to some embodiments.
Figure 8C:
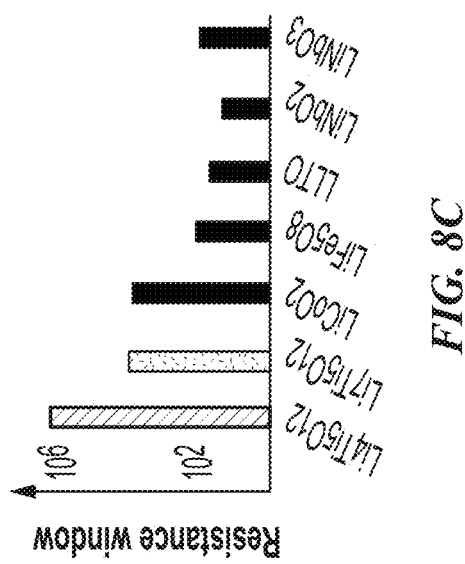
FIG. 8C shows resistance window properties of Li-titanate resistive switching devices compared to other Li-based memristive systems, according to some embodiments.
Figure 8F:
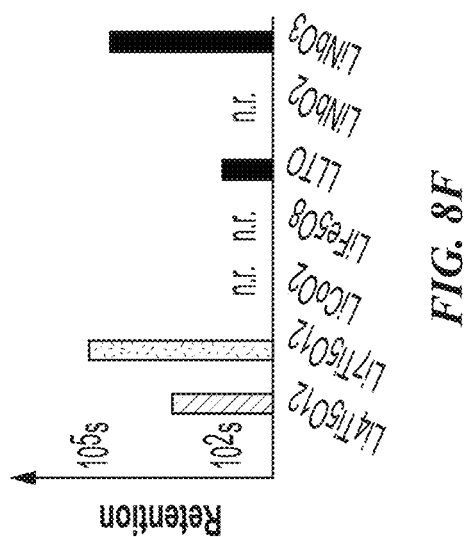
FIG. 8F shows retention properties of Li-titanate resistive switching devices compared to other Li-based memristive systems, according to some embodiments.

Resistance window (FIG. 8C): FIG. 8C shows that the Li-titanate based resistive switching devices of Examples 1 and 2 show a large resistance window.

Switching kinetics (FIG. 8D): FIG. 8D shows that the Li-titanate based resistive switching devices of Examples 1 and 2 show similar switching kinetics on the order of microseconds to milliseconds.

Figure 8E:
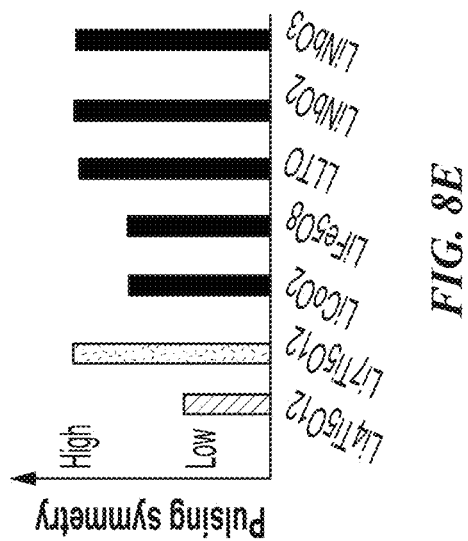
FIG. 8E shows pulsing symmetry properties of Li-titanate resistive switching devices compared to other Li-based memristive systems, according to some embodiments.

Pulsing symmetry (FIG. 8E): A high symmetry could be an important functionality towards the implementation of advanced neuromorphic computing architectures. FIG. 8E shows that the Li-titanate based resistive switching devices of Examples 1 and 2 display different degrees of symmetry, and that the $Li_7Ti_5O_{12}$ memristive device unit shows a high degree of symmetry.

Retention (FIG. 8F): While retention might be expected to be one of the weak points of this technology due to the lower activation barriers of Li-migration when compared to oxygen-based memristive devices, the $Li_7Ti_5O_{12}$ memristive device unit shows a large value of over 24 hours (~$10^5$ s). This value is already in line with other cation-based switches and could potentially be improved by further device engineering and fundamental understanding of the switching mechanism.

Endurance (FIG. 8G): The Li-titanate resistive switching devices of Examples 1 and 2 shown an endurance of 50-100 cycles, and it is not expected that the endurance will be the limiting factor on this technology.

Figure 8H:
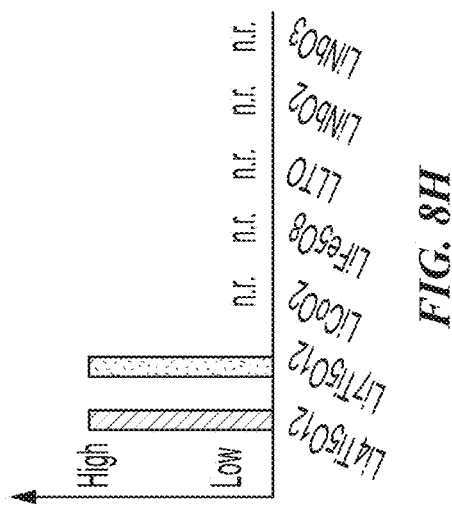
FIG. 8H shows processing tunability properties of Li-titanate resistive switching devices compared to other Li-based memristive systems, according to some embodiments.
Figure 8G:
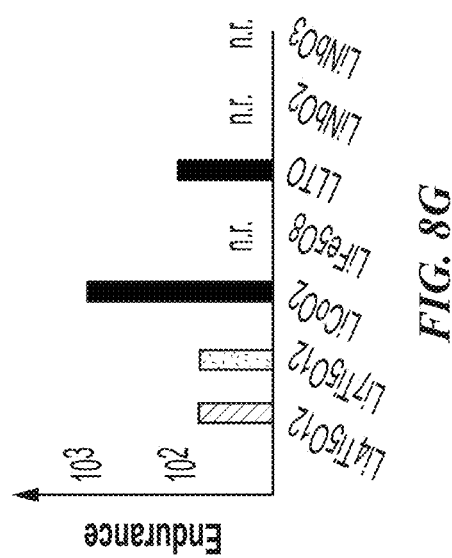
FIG. 8G shows endurance properties of Li-titanate resistive switching devices compared to other Li-based memristive systems, according to some embodiments.

Processing tunability (FIG. 8H): The results of Examples 1-3 suggest an ability to tune the performance of the resistive switching devices upon controlling the lithiation degree in the films. Tuning the lithiation degree of resistive switching devices could become an extra "knob" to further tune and control the resistive switching (e.g., memristive) properties of Li-based devices. FIG. 8H shows that the Li-titanate based resistive switching devices of Examples 1 and 2 display processing tunability.

EXAMPLE 5

This Example describes the fabrication and characterization of an exemplary resistive switching device comprising a lithium titanate-containing domain, a solid lithium ion source, and a solid lithium-conducting electrolyte domain between the lithium titanate-containing domain and the solid lithium ion source.

Figure 9A:
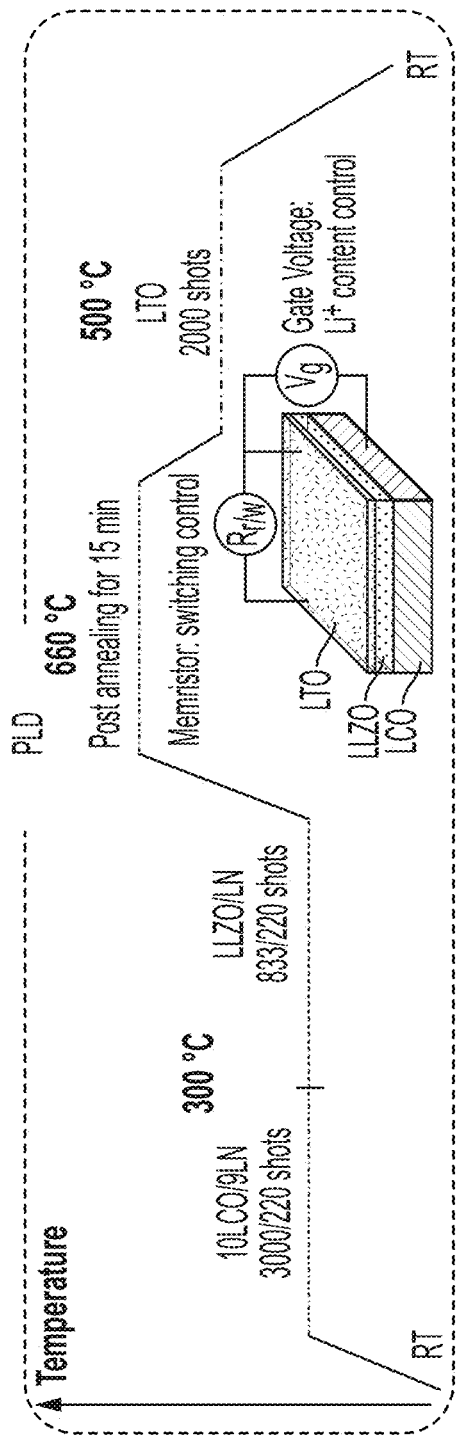
FIG. 9A shows a cross-sectional schematic diagram of an exemplary resistive switching device comprising a lithium titanate-containing domain comprising $Li_4Ti_5O_{12}$, $LiCoO_2$ as a solid lithium ion source, a solid lithium-conducting electrolyte domain comprising Al—$Li_7La_3Zr_2O_{12}$, and associated electrical circuitry and fabrication details, according to some embodiments.
Figure 9B:
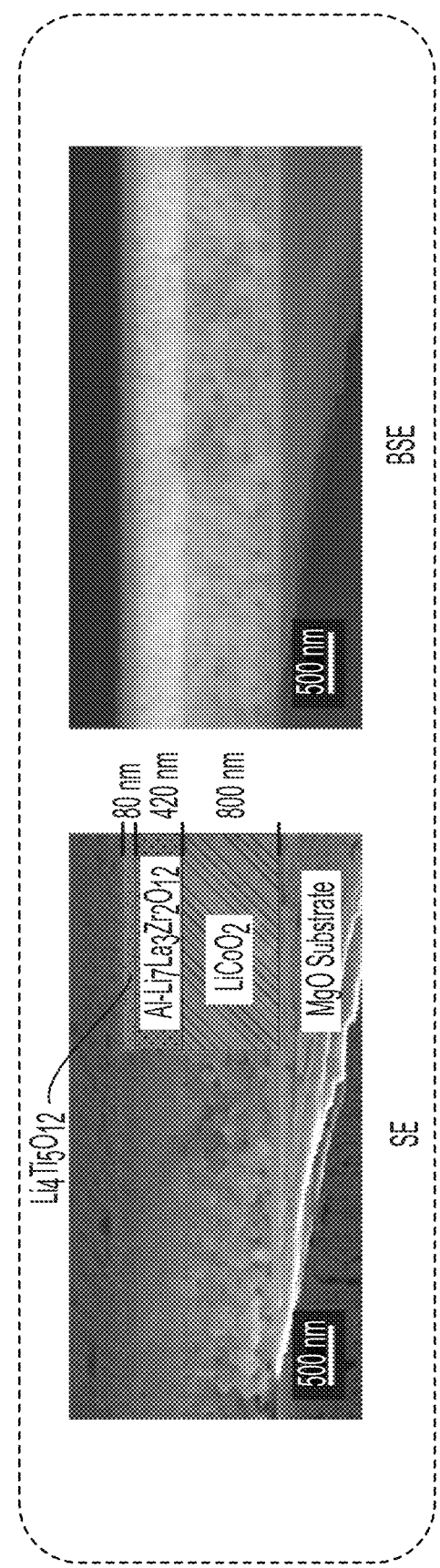
FIG. 9B shows scanning electron microscopy images of the resistive switching device of FIG. 9A, according to some embodiments.
Figure 9C:
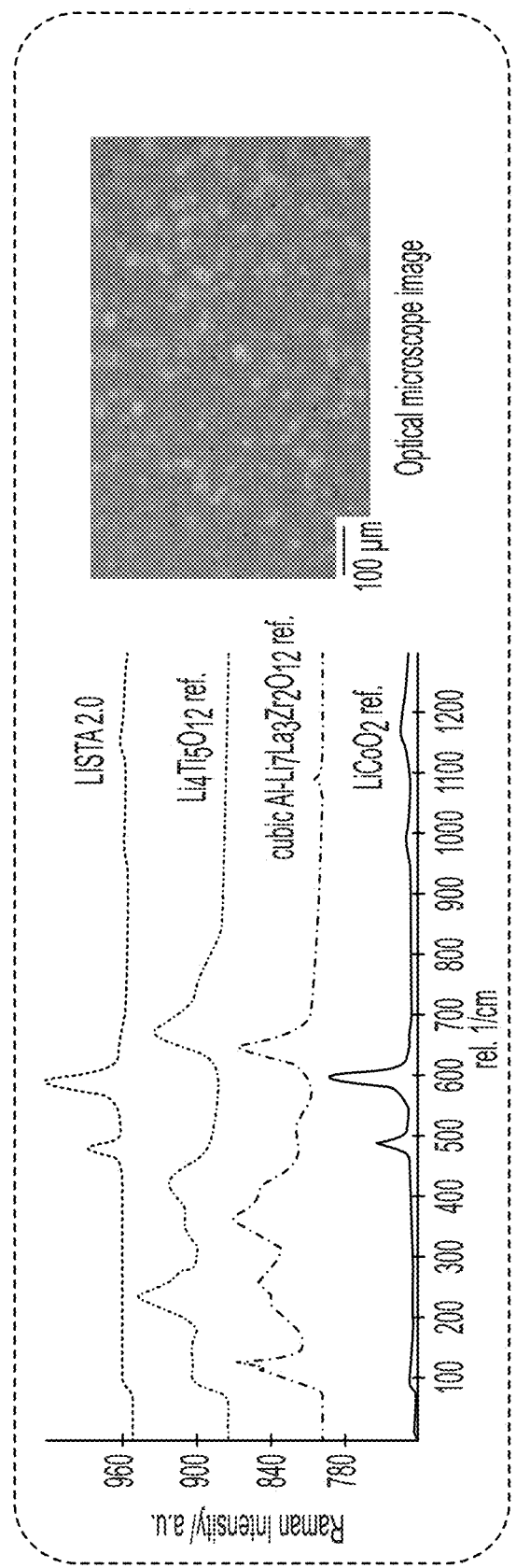
FIG. 9C shows Raman vibrational spectroscopy and an optical microscopy image of the resistive switching device of FIG. 9A, according to some embodiments.

As illustrated schematically in FIG. 9A, the resistive switching device was fabricated by Pulsed Laser Decomposition (PLD). First, a layer of $LiCoO_2$ (LCO) was deposited on top a substrate. The Li concentration in the $LiCoO_2$ layer was controlled by depositing alternative layers of $LiCoO_2$ and $Li_3N$ (LN) by PLD on to a magnesium oxide (MgO) substrate and a subsequent post-annealing step. In the alternating layer technique, the layers were deposited at 300° C. and then post-annealed at 660° C. for 15 min. Afterwards, an Al—$Li_7La_3Zr_2O_{12}$ (LLZO) layer was deposited in a similar fashion by depositing alternative layers of LLZO and $Li_3N$ and subsequent post-annealing at the same temperature and times. Finally, a $Li_4Ti_5O_{12}$ (LTO) layer was deposited on top of the LCO/LLZO stack. FIG. 9B shows electron microscopy images of the resulting layers using SE and BSE detection). Final device microfabrication was performed through standard optical lithography, where Pt electrodes were deposited on top of the LTO layer. The in-plane distance between the electrodes on the LTO layer ranged from 500 nm to 5 um. An additionally third electrode can be deposited in between the two in-plane electrodes. In general, this third electrode could serve as gate electrode to control the lithiation degree in the $Li_{4+3x}Ti_5O_{12}$ layer by inserting or extraction Li ions from/to the LCO layer through the LLZO. FIG. 9C shows Raman vibrational spectroscopy (left) and an optical microscope image (right) of the resulting resistive switching device (LISTA 2.0) as well as Raman spectra of the individual components as references. An analysis of the Raman spectrum of the resistive switching device indicated contributions to the spectra from all three layers (the LCO layer, the LLZO layer, and the LTO layer), with the LCO peaks being most significant. Raman spectroscopy data acquired at different sites along a lateral dimension of the device indicated identical phases at the edges and at the center of the film. Grazing angle XRD data acquired for the resistive switching device agreed with the Raman spectroscopy data, showing the presence of all three layers, with the LCO peaks being the strongest in the XRD measurements.

In-plane measurements can be made between the two in-plane electrodes on top of the LTO layer serving as 2-Terminal memristive units. In-plane resistive switching can be measured in such a configuration by applying an electric bias in the range 1-100 V and measuring the generated hysteresis loops in the current, similar to the cross-plane 2-Terminal devices.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, and/or method described herein. In addition, any combination of two or more such features, systems, articles, materials, and/or methods, if such features, systems, articles, materials, and/or methods are not mutually inconsistent, is included within the scope of the present invention.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A resistive switching device, comprising:
   a lithium titanate-containing domain;
   a first electrode in contact with the lithium titanate-containing domain; and
   a second electrode in contact with the lithium titanate-containing domain,
   wherein:
      the lithium titanate-containing domain comprises a first surface region facing the first electrode and a second surface region facing the second electrode, the first surface region being different than the second surface region;
      the first surface region comprises lithium titanate having a stoichiometry;
      the second surface region comprises lithium titanate having a stoichiometry that is the same as the stoichiometry of the first surface region;
      the lithium titanate-containing domain constitutes an entirety of the lithium titanate that is active within the resistive switching device; and
      there is at least one pathway from the first electrode, through the lithium titanate-containing domain, and to the second electrode that does not pass through electronically insulating material.

2. The resistive switching device of claim 1, wherein lithium titanate-containing domain has a first side and a second side, the first electrode is in contact with the first side, and the second electrode is in contact with the second side.

3. The resistive switching device of claim 1, wherein the first electrode and the second electrode are each in direct contact with the lithium titanate-containing domain.

4. The resistive switching device of claim 1, further comprising a solid lithium ion source and a solid lithium-conducting electrolyte domain between the lithium titanate-containing domain and the solid lithium ion source.

5. The resistive switching device of claim 1, wherein the lithium titanate-containing domain has a first electrical resistance state and a second electrical resistance state, and at least a portion of the lithium titanate-containing domain has a different structural phase in the first electrical resistance state than in the second electrical resistance state.

6. The resistive switching device of claim 1, wherein the lithium titanate-containing domain has a first electrical resistance state and a second electrical resistance state, and the volume of the lithium titanate-containing domain undergoes a change of less than or equal to 2% upon changing from the first electrical resistance state to the second electrical resistance state or from the second electrical resistance state to the first electrical resistance state.

7. The resistive switching device of claim 1, wherein lithium titanate is present in the lithium titanate-containing domain in an amount of greater than or equal to 60 wt %.

8. The resistive switching device of claim 1, wherein the lithium-titanate-containing domain comprises $Li_4Ti_5O_{12}$, $Li_7Ti_5O_{12}$, or a combination thereof.

9. The resistive switching device of claim 1, wherein the first surface region is in direct contact with the first electrode, and wherein the second surface region is in direct contact with the second electrode.

10. The resistive switching device of claim 2, wherein the first surface region is part of the first side, the second surface region is part of the second side, the first surface region is in direct contact with the first electrode, and the second surface region is in direct contact with the second electrode.

11. The resistive switching device of claim 1, wherein both the first electrode and the second electrode are in contact with a same side of the lithium titanate-containing domain.

12. The resistive switching device of claim 11, wherein the first surface region and the second surface region are both part of the same side, the first surface region is in direct contact with the first electrode, and the second surface region is in direct contact with the second electrode.

13. The resistive switching device of claim 1, wherein the stoichiometry of the lithium titanate of the first surface region and the second surface region is $Li_4Ti_5O_{12}$.

14. The resistive switching device of claim 1, wherein the stoichiometry of the lithium titanate of the first surface region and the second surface region is $Li_7Ti_5O_{12}$.

* * * * *